(12) United States Patent
Tsukuda et al.

(10) Patent No.: US 6,521,827 B2
(45) Date of Patent: Feb. 18, 2003

(54) SHEET MANUFACTURING METHOD, SHEET, SHEET MANUFACTURING APPARATUS, AND SOLAR CELL

(75) Inventors: Yoshihiro Tsukuda, Fujiidera (JP); Hiroshi Taniguchi, Nara (JP); Kozaburou Yano, Nabari (JP); Kazuto Igarashi, Kitakatsuragi-gun (JP); Hidemi Mitsuyasu, Kitakatsuragi-gun (JP); Tohru Nunoi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 92 days.

(21) Appl. No.: 09/723,278

(22) Filed: Nov. 29, 2000

(65) Prior Publication Data
US 2001/0044163 A1 Nov. 22, 2001

(30) Foreign Application Priority Data

Nov. 30, 1999 (JP) .............................. 11-339016
Oct. 26, 2000 (JP) ........................ 2000-326977

(51) Int. Cl.[7] ........................... H01L 31/04; C30B 29/06
(52) U.S. Cl. ..................... 136/261; 136/258; 136/256; 136/249; 257/431; 257/466; 117/11; 117/16; 117/47; 117/931; 423/348; 428/446
(58) Field of Search ................... 136/258, 256, 136/261, 249; 257/431, 466; 117/11, 16, 41, 42, 47, 59, 60, 922, 931, 934; 423/348; 428/446

(56) References Cited

U.S. PATENT DOCUMENTS 4,231,755 A    11/1980  Herzer et al.
5,080,725 A *  1/1992  Green et al. ................. 136/256
6,156,968 A * 12/2000  Nishimoto et al. ......... 136/252
6,207,890 B1 * 3/2001  Nakai et al. ................. 136/246
6,240,647 B1 * 7/2002  Ji et al. ....................... 136/259
6,413,313 B1 * 7/2002  Yoshida et al. ............. 117/200
2001/0004874 A1 * 6/2001  Igarashi et al. ............... 117/11

FOREIGN PATENT DOCUMENTS

| JP | 61-275119 | 12/1986 |
| JP | 6-64913 | 3/1994 |
| JP | 7-256624 | 10/1995 |
| JP | 10-29895 | 2/1998 |
| WO | WO-98/43304 A1 * | 10/1998 |

* cited by examiner

Primary Examiner—Alan Diamond
(74) Attorney, Agent, or Firm—Nixon & Vanderhye P.C.

(57) ABSTRACT

An inexpensive sheet with excellent evenness and a desired uniform thickness can be obtained by cooling a base having protrusions, dipping the surfaces of the protrusions of the cooled base into a melt material containing at least one of a metal material and a semiconductor material for crystal growth of the material on the surfaces of the protrusions. In addition, by rotating a roller having on its peripheral surface protrusions and a cooling portion for cooling said protrusions, the surfaces of the cooled protrusions can be dipped into a melt material containing at least one of a metal material and a semiconductor material for crystal growth of the material on the surfaces of the protrusions. Thus, a sheet with a desired uniform thickness can be obtained without slicing process.

9 Claims, 36 Drawing Sheets

42

45

44

47

46

49

48

53

52

56

57

SHEET MANUFACTURING METHOD, SHEET, SHEET MANUFACTURING APPARATUS, AND SOLAR CELL

BACKGROUND OF THE INVENTION

1. Field of the Invention

The present invention relates to a sheet manufacturing method and a manufacturing apparatus of manufacturing a sheet (a plate-like base) from a melt containing a metal material or a semiconductor material. Particularly, the present invention relates to a technique for inexpensively manufacturing solar cells, where a silicon sheet for a solar cell is directly manufactured from a silicon melt. More particularly, the present invention relates to a silicon sheet manufacturing apparatus and method enabling manufacture of a silicon sheet, which has protrusions or curved portions at least on the melt side when viewed in section.

2. Description of the Background Art

Examples of conventional methods of manufacturing polycrystalline silicon wafers for use in solar cells include a method of casting to form a polycrystalline body of e.g., silicon, disclosed in Japanese Patent Laying-Open No. 6-64913. In this method, a high-purity silicon material containing a dopant of phosphorus, boron, or the like, is heated to melt in a crucible placed in an inert ambience. Then, a silicon melt is poured into a casting mold for gradually cooling, so as to provide a polycrystalline ingot. Accordingly, for manufacturing polycrystalline silicon wafers for use in solar cells from thus obtained polycrystalline ingot, the ingot is to be sliced by a wire saw or inner diameter blade.

A method of continuously casting a silicon plate, disclosed in Japanese Patent Laying-Open No. 7-256624, involves manufacture of a silicon sheet without slicing. In this method, a silicon melt is poured into a horizontal heat casting mold and a dummy graphite plate is horizontally inserted such that its leading end is dipped into the silicon melt under a control plate. When the silicon adheres to the leading end of the graphite plate, the silicon plate is horizontally pulled out with use of a roller. Coolant gas supplied from gas blow-off pipe of a cooling apparatus provides for continuous formation of the silicon plate.

Another method of manufacturing a silicon sheet uses a manufacturing apparatus for a silicon ribbon disclosed in Japanese Patent Laying-Open No. 10-29895. The manufacturing apparatus for a silicon ribbon generally has a portion of heating to melt silicon and a cooling roller of a heat-resistant material. The cooling roller, with one end of carbon net wound thereon, is directly dipped into a silicon melt for forming a silicon ribbon on the surface of the cooling roller. The carbon net wound on the cooling roller is pulled with rotation of the cooling roller for rolling out thus formed silicon ribbon. As such, the manufacturing apparatus allows the silicon ribbon, formed from the silicon that first adhered to the carbon net, to be continuously rolled out.

However, the above described conventional methods or apparatuses of manufacturing a silicon plate or a silicon sheet suffer from the following problems. The method of casting a crystalline body of e.g. silicon disclosed in the aforementioned laid-open application No. 6-64913 requires slicing of the polycrystalline ingot, whereby a slicing loss is caused corresponding to a thickness of the wire saw or inner diameter blade. This results in yield decrease and it becomes difficult to provide wafers at low cost.

The method of continuously casting the silicon plate disclosed in the aforementioned laid-open application No. 7-256624 controls the thickness of the silicon plate by pulling out the silicon plate under the thickness control plate. In this case, it is difficult to control a thickness of 600 $\mu$m or smaller as is employed for solar cells.

In the method of manufacturing the silicon ribbon disclosed in the aforementioned laid-open application No. 10-29895, the silicon ribbon formed from the silicon that first adhered to the carbon net is continuously pulled and rolled out with rotation of the cooling roller. However, the silicon ribbon is somewhat fragile due to reaction of the carbon net and the silicon. If the formed silicon is extremely thin, the silicon ribbon may break to fall during pulling operation. In this situation, the operation must be stopped and productivity decreases.

Further, a mechanism is provided which pressurizes to apply the silicon melt onto the peripheral surface of the cooling roller by jet pressure. Since the pressure is exerted by agitation of the silicon melt, unwanted pressure may be exerted to the formed silicon, thereby causing defects.

A growth rate of silicon is determined by a number of factors including a temperature of a heater for maintaining the silicon in a molten state, dipping depth, type and flow rate of coolant gas circulating in the cooling roller, rotation speed of the cooling roller and the like. Thus, it is technically difficult to stably pull out the silicon ribbon while controlling the growth rate.

Further, a wedge is provided for removing any silicon residue left on the surface of the cooling roller. Such a wedge is brought into direct contact with the surface of the cooling roller where silicon grows, thereby disadvantageously scratching the surface of the cooling roller or striping a remover applied thereon. Consequently, evenness of the silicon ribbon is impaired.

An inexpensive solar cell requires a base which has excellent evenness and well-controlled thickness and which saves a slicing loss. In any of these conventional cases, it is difficult to provide a thin base with excellent evenness manufactured by mass production at low cost.

SUMMARY OF THE INVENTION

An object of the present invention is to overcome the aforementioned problems associated with the conventional technique, so as to provide a method of manufacturing an inexpensive sheet with a desired thickness and excellent uniformity and evenness. The method enables manufacture of the silicon sheet with a desired thickness and excellent evenness without slicing while ensuring productivity.

According to the present invention, the above mentioned object is achieved in the following manner.

According to one aspect of the present invention, a sheet manufacturing method is provided in which a base with protrusions is cooled and the surfaces of the protrusions of the cooled base are dipped into a melt material containing at least one of metal and semiconductor materials to form crystals of the material on the surfaces of the protrusions. Thus, a sheet of the material is produced.

According to another aspect of the present invention, a sheet manufacturing method is provided in which a roller having on its peripheral surface protrusions as well as a cooling system for cooling the protrusions is rotated and the surfaces of the cooled protrusions are dipped into a melt material containing at least one of metal and semiconductor materials to form crystals of the material on the surfaces of the protrusions. Thus, a sheet formed of the material is produced.

According to still another aspect of the present invention, in the sheet manufacturing method, the protrusions include at least one of a dot-like protrusion or a linear protrusion.

According to still another aspect of the present invention, in the sheet manufacturing method, the protrusions include at least one of a dot-like protrusion and a linear protrusion in addition to a planar protrusion.

According to still another aspect of the present invention, in the sheet manufacturing method, the protrusions are coated with a material of at least one of silicon carbide, boron nitride, silicon nitride, and pyrolitic carbon.

According to still another aspect of the present invention, in the sheet manufacturing method, the crystals of the material grow from the protrusions.

According to still another aspect of the present invention, a sheet is provided which has curved portions formed by cooling a base with protrusions, dipping the surfaces of the protrusions of the cooled base into a melt material containing at least one of metal and semiconductor materials, and forming crystals of the material in a curved shape on the surface of the base from the protrusions.

According to still another aspect of the present invention, a sheet is provided which has curved portions and planar portions formed by cooling a base with protrusions including at least one of a dot-like protrusion and a linear protrusion in addition to a planar protrusion, dipping the surfaces of the protrusions of the cooled base into a melt material containing at least one of metal and semiconductor materials, forming crystals of the material on the surface of the base in a curved shape from the dot-like protrusion or linear protrusion, and forming crystals of the material on the surface of the base in a planar shape from the planar protrusion.

According to still another aspect of the present invention, a sheet manufacturing apparatus is provided which includes: a roller having on its peripheral surface protrusions and a cooling system for cooling the protrusions; and a crucible into which includes a material containing at least one of metal and semiconductor material and which allows the protrusions to be dipped into the melt by rotation of the roller.

According to still another aspect of the present invention, a solar cell is provided by forming an electrode on a sheet having a curved portion formed by cooling a base with protrusions, dipping the surfaces of the protrusions of the cooled base into a material containing at least one of a metal material and a semiconductor material, and forming crystals of the material on the surface of the base in a curved shape from the protrusion.

According to still another aspect of the present invention, a solar cell is provided by forming an electrode on a planar portion of a sheet with a curved portion and a planar portion obtained by cooling a base with protrusions including at least one of dot-like protrusions and linear protrusions in addition to planar protrusions, dipping the surfaces of the protrusions of the cooled base into the melt material containing at least one of a metal material and a semiconductor material, forming crystals of the material on the surface of the base in a curved shape from the dot-like protrusion or the linear protrusion, and forming crystals of the material on the surface of the base in a planar shape from the planar protrusion.

According to still another aspect of the present invention, a silicon sheet manufacturing apparatus is provided for manufacturing a silicon sheet by rotating a cooling roller to solidify and form a silicon sheet. The apparatus is characterized in that the surface of the cooling roller is provided with protrusions arranged in a dot-like pattern or a linear pattern when viewed from above.

According to still another aspect of the present invention, the silicon sheet manufacturing apparatus is characterized in that spaces between the protrusions are in a V or U like shape (such spaces are hereinafter referred to as V or U grooves).

According to still another aspect of the present invention, the silicon sheet manufacturing apparatus is characterized in that the surface of the cooling roller is coated with SiC.

According to still another aspect of the present invention, the silicon sheet manufacturing apparatus is characterized in that the pitch of the V or U groove is at least 0.05 mm and at most 5 mm.

According to still another aspect of the present invention, the silicon sheet manufacturing apparatus is characterized in that the height of the protrusions is at least 0.05 mm and at most 5 mm.

According to still another aspect of the present invention, a silicon sheet manufacturing method is provided for manufacturing a silicon sheet by rotating a cooling roller to solidify and form crystals of a silicon melt. The method is characterized in that the crystals are solidified and formed from protrusions of the cooling roller arranged in a dot-like pattern or a linear pattern when viewed from above.

According to still another aspect of the present invention, a solar cell is provided by forming an electrode on a silicon sheet obtained by rotating a roller having on its peripheral surface protrusions including at least one of a dot-like protrusion and a linear protrusion as well as a cooling portion for cooling the protrusions, dipping the surfaces of the cooled protrusions, and forming silicon crystals on the surfaces of the protrusions.

For producing a silicon sheet, the surface of the cooling roller for forming the silicon sheet has protrusions arranged in a dot-like pattern or a linear pattern and a silicon melt is solidified at the protrusions, so that curved protrusions are formed at least on one side of the silicon sheet. The silicon sheet of the present invention is characterized by a curved surface formed on the side of the silicon melt. The continuous protrusions serve as ribs to save the silicon material used and to enable mass production of silicon sheets with reduced thickness and yet sufficient strength.

The silicon sheet manufacturing apparatus according to the present invention may include: a roller having on its peripheral surface protrusions including at least one of a dot-like protrusion and a linear protrusion as well as a cooling portion for cooling the protrusions; and a crucible containing a silicon melt and capable of dipping the protrusions into the silicon melt by rotation of the roller.

The cooling roller is characterized in that the spaces between the protrusions on the surface of the cooling roller dipped into the silicon melt are V or U grooves. The protrusions with V or U grooves are formed in the surface of the cooling roller in a dot-like pattern or in a linear pattern with respect to a rotation direction. The top portions of the protrusions are dipped into the silicon melt, which are in turn cooled from inside. This produces crystal nuclei of silicon at the top portions of the protrusions, which gradually grow and combine together, i.e., one nuclei combines with those growing from the adjacent top portions. Thus, a silicon sheet is produced. In this way, stable growth of the silicon sheet is enabled.

Further, use of the cooling roller having the V or U groove-structure enables manufacture of a corrugation or wave-like silicon sheet directly on the cooling roller, depending on manufacturing conditions of the silicon sheet. Accordingly, the sheet has curved portions not only on the melt side but also on the side of the cooling roller, in accordance with the above mentioned dot-like pattern or linear pattern. This is due to changes in shape of the silicon crystals growing from peaks of the V or U grooves. Such curved portions provide for significant reduction in silicon material used.

In addition, the following method further facilitates industrialization. A silicon carbide (SiC) coating is applied to the surface of the cooling roller. According to the above mentioned structure, the presence of the SiC film on the surface of the cooling roller prevents contamination by the material used for the cooling roller. The pitch of the V or U grooves of the cooling roller is at least 0.05 mm and at most 5 mm. According to the structure, the crystal nuclei of the silicon are produced only at the peaks of the V or U grooves of the cooling roller, so that the grain size or thickness of the silicon sheet can readily be controlled.

In the structure, although a pitch less than 0.05 mm may increase the number of protrusions to be dipped into the silicon melt to achieve higher growth rate, it is not desirable since the grain size would become extremely small. Although a pitch greater than 5 mm may provide a greater grain size, in this case, a problem associated with the growth rate arises.

In the structure, the height of the protrusions of the cooling roller, i.e., the depth of the V or U grooves is desirably at least 0.05 mm and at most 5 mm.

In the structure, only the peaks of V or U grooves of the cooling roller can be reliably dipped into the silicon melt in a portion for heating and melting silicon. The depth smaller than 0.05 mm may disadvantageously cause troughs of the V or U grooves of the cooling roller to be dipped into the silicon melt. As a result, a contact area increases and removability is impaired.

As in the foregoing, by controlling the surface structure of the cooling roller and properly setting a dipping condition or the like, a silicon sheet with a moderate thickness is produced.

The silicon sheet manufacturing apparatus further includes a bar-like remover for a silicon sheet, which is disposed at the trough of the cooling roller.

In the structure, the crystal nuclei of silicon are produced at the peaks of V or U grooves of the cooling roller, which gradually grow to combine with those from adjacent peaks to form a silicon sheet. Thus formed silicon sheet is readily removed as a single sheet from the V or U grooves of the cooling roller.

In this case, the remover is disposed at the trough of the cooling roller. Accordingly, the remover would not cause any damage to the peaks of the V or U grooves at which crystals grow. In addition, the presence of the SiC coating on the cooling roller can prevent a substance at the trough from falling.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will now be described in detail. The present invention is a sheet manufacturing method of directly forming on the surface of a cooled base crystals of a melt material containing at least one of a metal material and a semiconductor material and is characterized by the surface structure of the base. More specifically, the surface of the base has protrusions which are arranged in a dot-like pattern or a linear pattern when viewed from above.

The linear protrusions refer to protrusions formed by grooves in a planar surface of the base. The concept of the linear protrusions include polishing and cutting formed on the surface of the base by machine processing of polishing or cutting. Namely, the linear protrusions include every protrusion in the surface of the base. The linear protrusions or dot-like protrusions are formed in the following manner. For example, when grooves having a width of 1 mm are machined in the planar surface of the base, the linear protrusions having a pitch of 1 mm are formed in the surface of the base. Further, the base with the linear protrusions is rotated for example by 90° and the grooves having a width of 1 mm are similarly formed. As a result, dot-like protrusions are formed having a pitch of 1 mm. The grooves in the surface of the planar base provide the linear or dot-like protrusions. Further, such linear or dot-like protrusions may be polishing traces or cutting traces caused by polishing or cutting. Namely, the concept of the protrusions as used herein includes any protrusion in the surface of the base.

Figure 1:
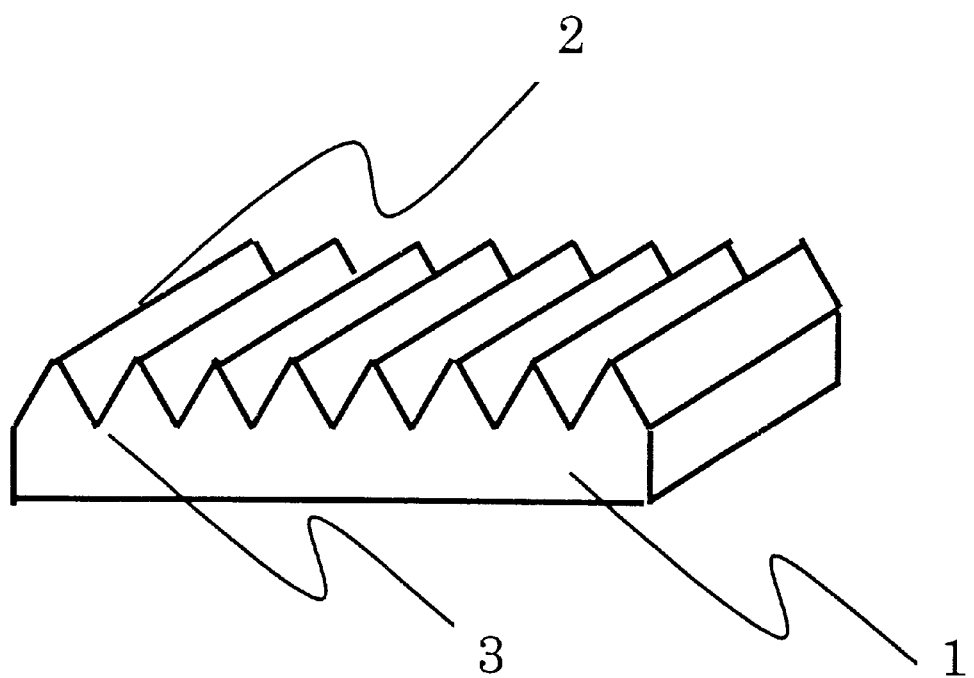
FIG. 1 is a perspective view showing a base with linear protrusions of the present invention.
Figure 2:
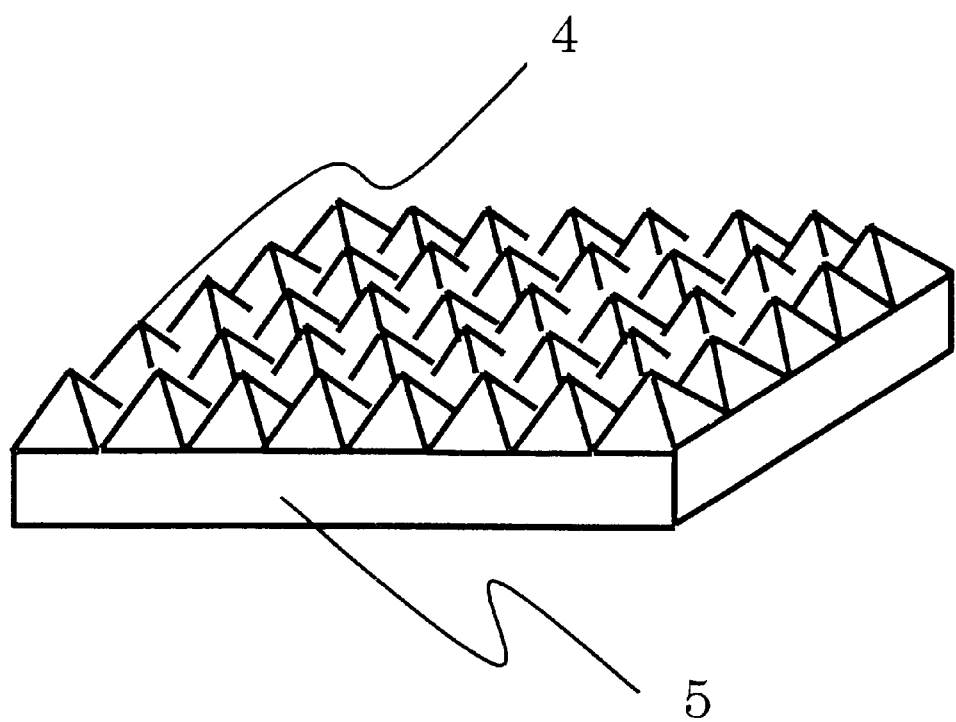
FIG. 2 is a perspective view showing a base with dot-like protrusions of the present invention.

Referring to FIGS. 1 and 2, a feature of the base of the present invention will be described. The bases shown in FIGS. 1 and 2 have protrusions in their respective surfaces. The base shown in FIG. 1 has linear protrusions, whereas the base shown in FIG. 2 has dot-like protrusions.

In FIGS. 1 and 2, reference numerals 1, 2, 3, 4, and 5 respectively denote the base with protrusions, linear protrusions of the base, grooves of the base, dot protrusions, and the base with dot protrusions. Note that peaks of linear protrusions 2 and dot protrusions 4 may be rounded. The terms "dot-protrusion" and "dot-like protrusion" are used interchangeably herein.

In the case of a planar base without any protrusions formed in the surface of base 1, a sheet is formed by crystal growth on the planar base. In such a case, however, it would be difficult to remove the sheet from the base due to relatively high adhesion strength of the sheet and the base. In addition, in the case of crystal growth on the planar base, crystal nuclei may be randomly produced on the base. Consequently, dendritic growth becomes dominant, resulting in large protrusions of the sheet and making it difficult to form crystals around those formed by dendritic growth. Thus, it is difficult to produce, with use of the planar base, a sheet having uniform protrusions which can be easily removed from the base.

At least one linear protrusion 2 and dot-like protrusion 4 facilitates removal of the sheet from the base. This is because at least one group of linear protrusion 2 of the base 1 and dot protrusion of the base 5 enables setting/control of the starting point of crystallization (i.e., a point at which crystal nuclei is produced). Further, at least one group of linear protrusions 2 and dot-like protrusions 4 promotes nuclei production at the peak of the protrusions since such protrusion is first dipped into the melt. The protrusions provide improved removability of the sheet from the base and facilitate control of uniformity of the protrusions.

Although the protrusions in the surface of the base shown in FIGS. 1 and 2 form V grooves, the present invention is not particularly limited to such configuration. The depths of the grooves in the base are the same, while not limiting. The depths of the grooves may vary as necessary according to the material used.

Now, the feature of the base of the present invention will be described with reference to FIGS. 3 and 4. The bases shown in FIGS. 3 and 4 have protrusions in their surfaces. A base 7 of FIG. 3 has linear protrusions 2 and planar protrusions 6. The base of FIG. 4 has dot-like protrusions 4 and planar protrusions 6. Planar protrusions 6 refer to protrusions formed in the surface of the base as a result of formation of grooves.

Figure 3:
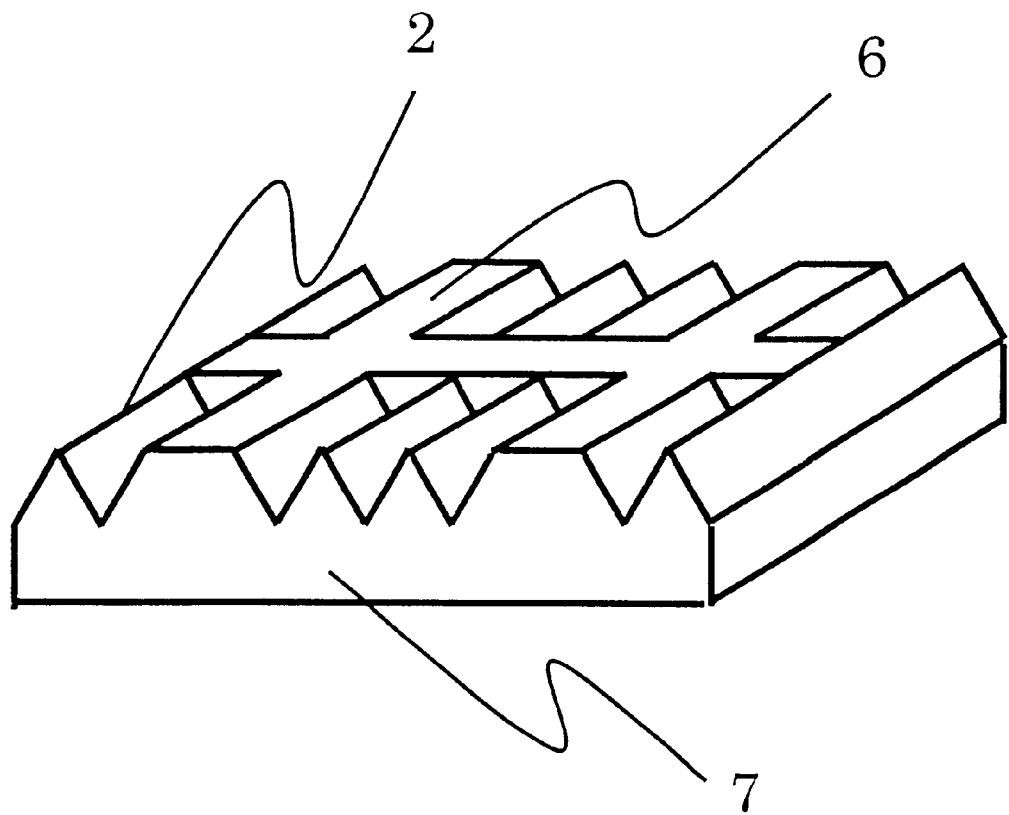
FIG. 3 is a perspective view showing a base with linear protrusions and planar protrusions of the present invention.
Figure 4:
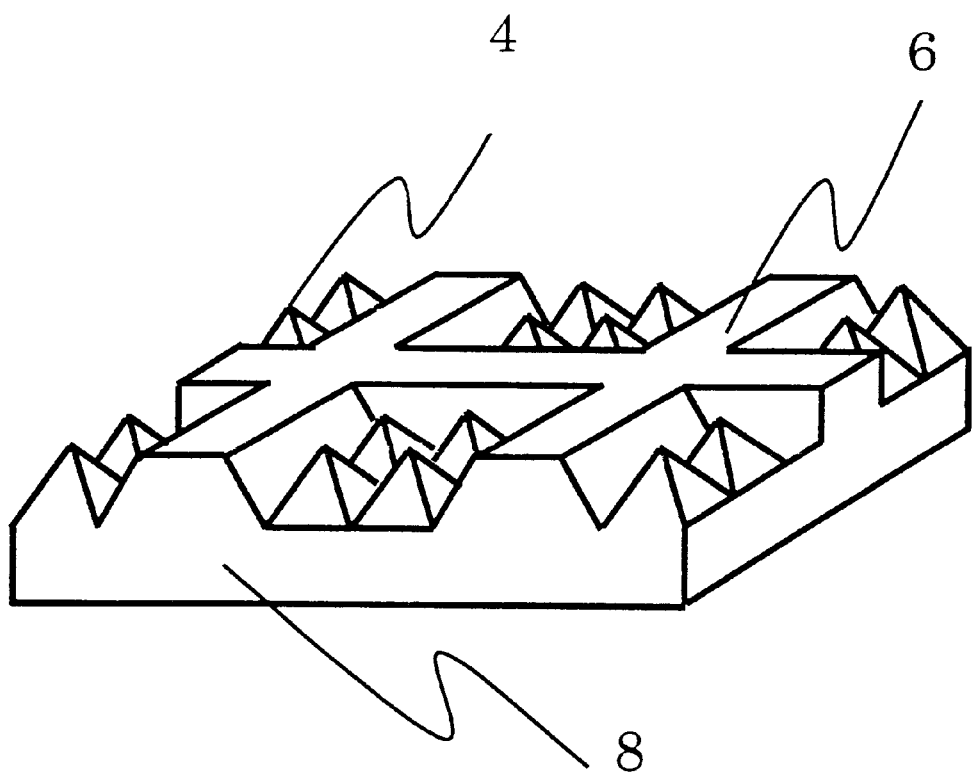
FIG. 4 is a perspective view showing a base with dot-like protrusions and planar protrusions of the present invention.

In FIGS. 3 and 4, reference numeral 6 denotes the planar protrusions. The protrusions have at least one of dot-like protrusions and linear protrusions, and must have planar protrusions. In the present invention, at least one of linear protrusions 2 and dot-like protrusions 4 are arranged in addition to planar protrusions 6.

At least one group of linear protrusions 2 and dot-like protrusions 4 facilitates removal of the sheet from the base. Planar protrusions 6 further facilitate removability control.

Figure 5A:
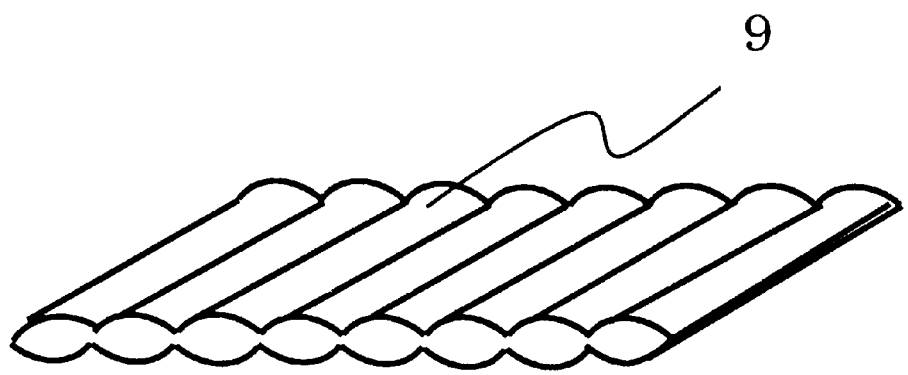
FIG. 5A is a schematic perspective view showing a sheet.
Figure 5B:
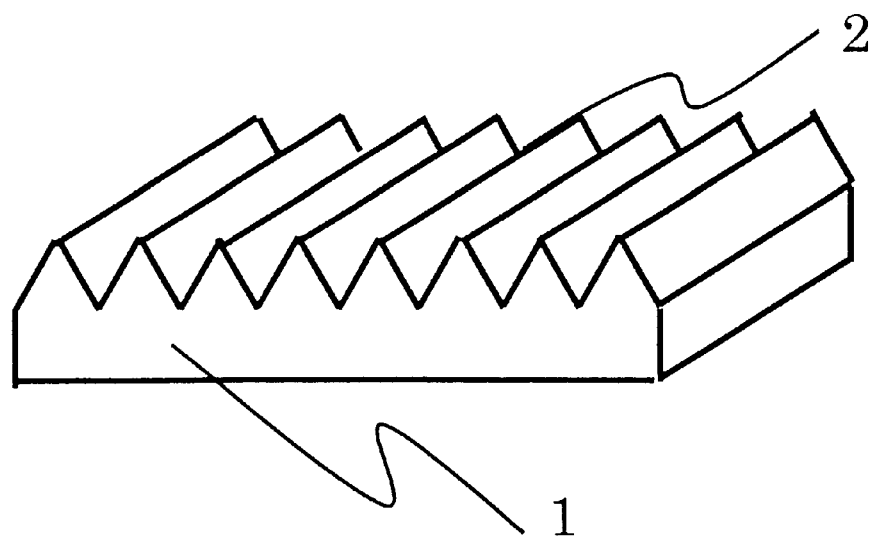
FIG. 5B is a schematic perspective view showing a base with linear protrusions of the present invention.

Next, referring to FIG. 5, a sheet produced using base 1 with protrusions shown in FIG. 1 will be described. FIG. 5 is a perspective view showing a positional relationship between base 1 with linear protrusions 2 and a sheet 9 produced by crystal growth on the surface of base 1.

A sheet produced by solidification of the melt and crystal growth on base 1 has curved portions. This is because crystals grow from linear protrusions 2 of base 1 in a curved shape. Thus, the produced sheet has curved portion.

Crystal growth on the base occurs in the following manner. Namely, crystal nuclei are produced at peaks of linear protrusions 2 since these protrusions are first dipped into the melt. Then, since base 1 is cooled, crystal growth occurs from the crystal nuclei. The curved crystals on linear protrusions 2 grow to combine with those from adjacent linear protrusions 2, so as to produce sheet 9 with curved portions.

The shape of sheet 9 does not conform to the protrusions of base 1 as shown in FIG. 5. The shape of sheet 9 is approximately as shown in FIG. 5, depending on various factors including surface tension of the melt, the temperature of the cooled base, the moving or rotating speed of the base, the shape of the protrusions and the like.

This is because crystal growth starts at the peaks of linear protrusions 2 and the melt solidifies before crystal growth proceeds deeper in the grooves of the protrusions, and thus sheet 9 is produced. When sheet 9 is produced by use of base 1 with linear protrusions 2, a contact area between the base and the sheet would be smaller than in the case of the planar base. Smaller contact area of the base and the sheet facilitates removal of the sheet from the base.

If the temperature of the cooled base or the melt is high, or if the moving or rotating speed of the base is low, the melt will disadvantageously proceed deeper in the grooves. In this case, removability of the sheet from the base would be impaired.

Figure 6A:
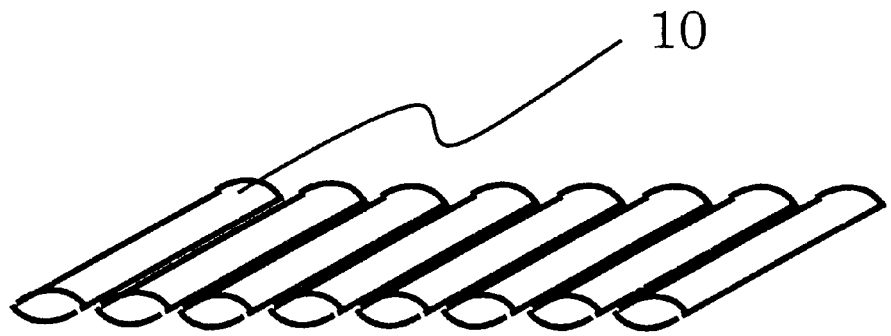
FIG. 6A is a schematic perspective view showing a sheet.
Figure 6B:
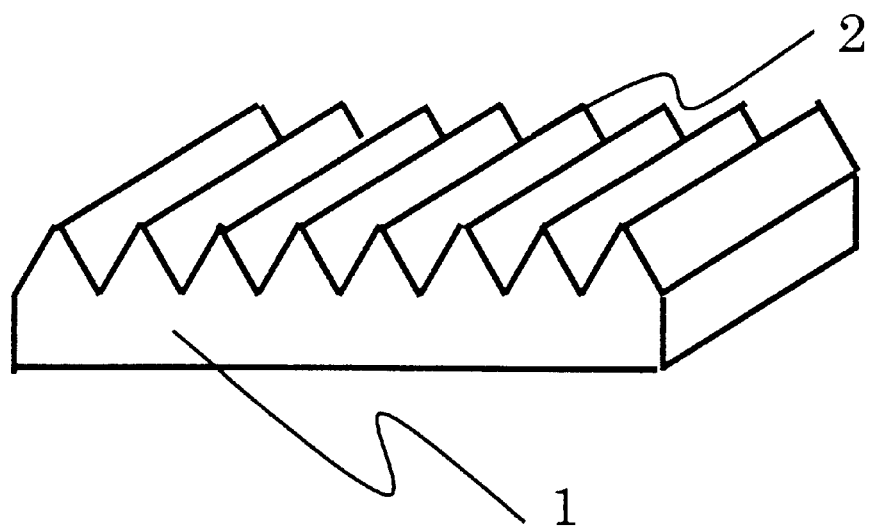
FIG. 6B is a schematic perspective view showing a base with linear protrusions of the present invention.
Figure 7A:
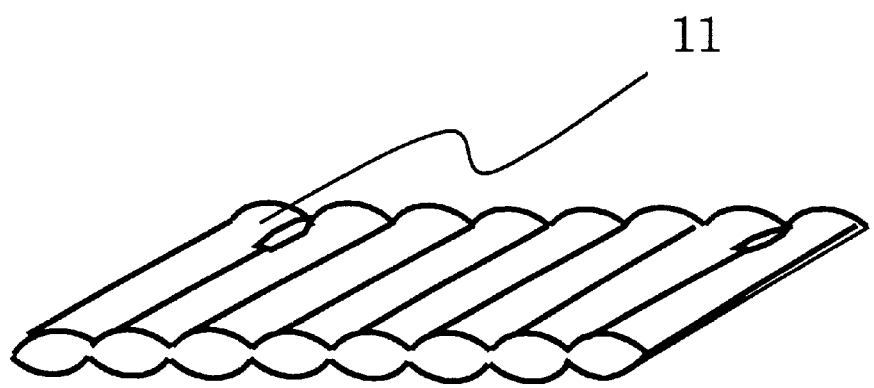
FIG. 7A is a schematic perspective view showing a sheet.
Figure 7B:
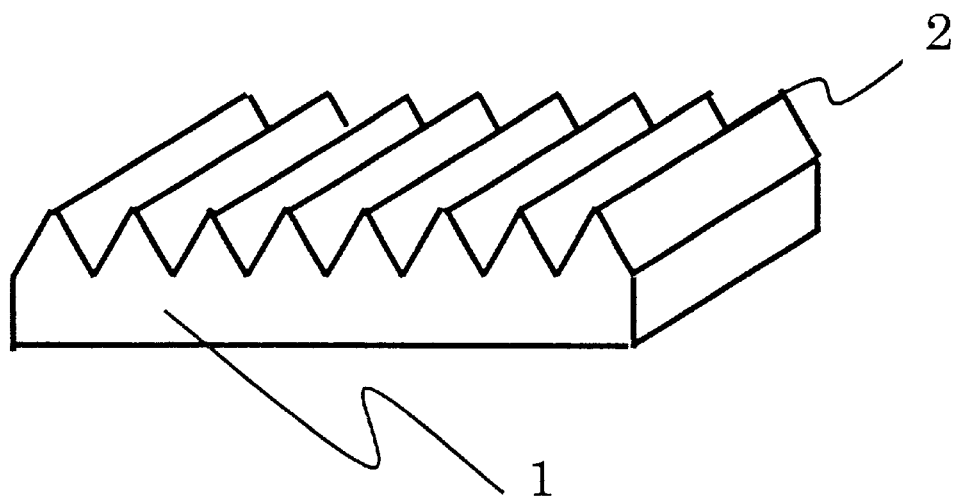
FIG. 7B is a schematic perspective view showing a base with linear protrusions of the present invention.

On the contrary, if the base is sufficiently cooled down, the moving or rotating speed of the base is high, and the temperature of the melt is low, crystal growth rapidly proceeds after formation of crystal nuclei to produce a sheet. However, if sufficient time is not allowed before crystal growth into a sheet such as when the moving speed of the base is too high, crystal growth over linear protrusions 2 is insufficient as shown in FIG. 6. As a result, bar-like crystals are produced. In some cases, crystals would not grow partially over the grooves as shown in FIG. 7.

Figure 8A:
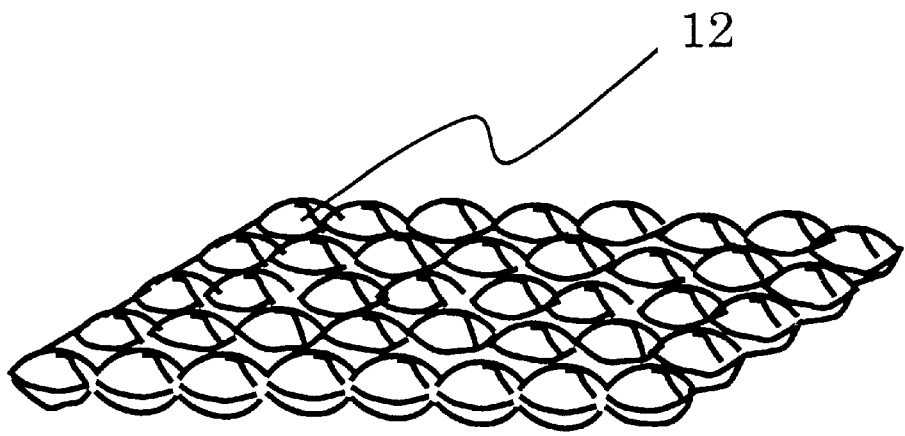
FIG. 8A is a schematic perspective view showing a sheet.
Figure 8B:
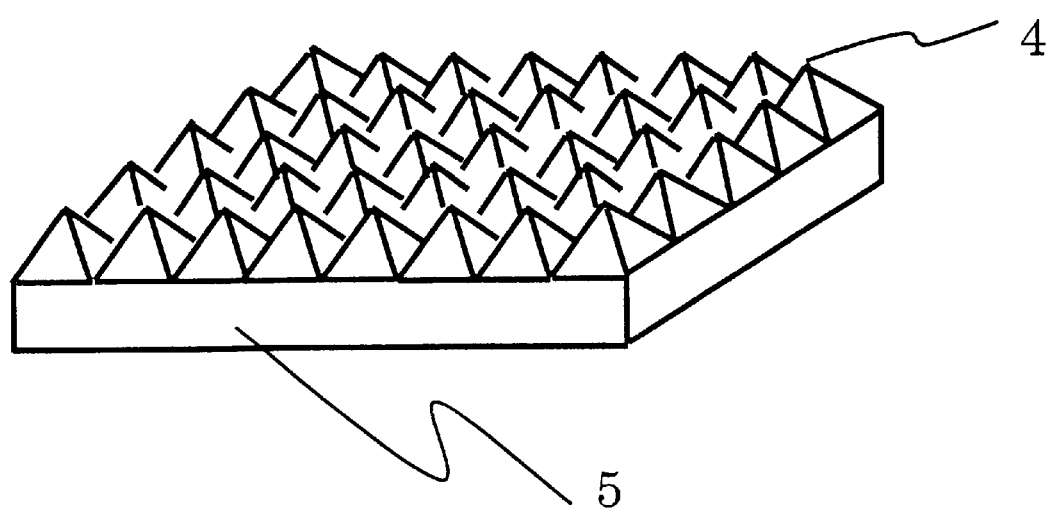
FIG. 8B is a schematic perspective view showing a base with dot-like protrusions of the present invention.

On the other hand, even if the cooling of the base is insufficient, a sheet can be still produced by lowering the moving speed of the base or the rotating speed of the roller having the cooling system, or further decreasing the melt temperature. In the above, the present invention has been described as using the base of FIG. 1 to produce sheet 9 with reference to FIG. 5. In the case of the base of FIG. 2, crystal nuclei are first formed at dot-like protrusions 4, rather than linear protrusions 2, as shown in FIG. 8. However, subsequent crystal growth occurs as in the case of the base of FIG. 1.

Namely, crystal nuclei is first formed on cooled dot-like protrusion 4 and then crystal growth occurs based on the crystal nuclei. As crystal growth proceeds, crystals formed from dot-like protrusions 4 combine to form a sheet 12. Thus produced sheet 12 has curved portions.

Higher degree of removability of the sheet from the base is attained in the case of dot-like protrusions 4 than in the case of linear protrusions 2. The removability largely depends on the contact area between the sheet and the base.

Figure 9A:
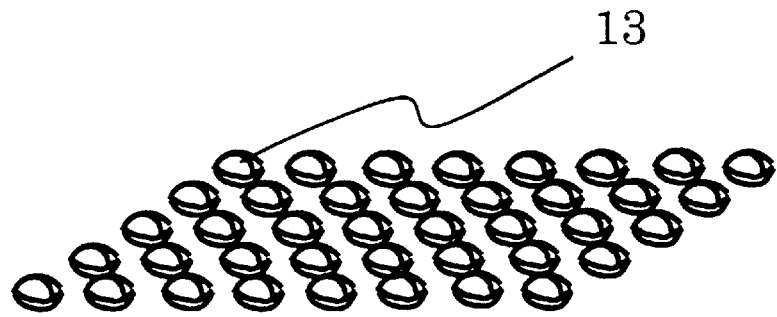
FIG. 9A is a schematic perspective view showing a sheet.
Figure 9B:
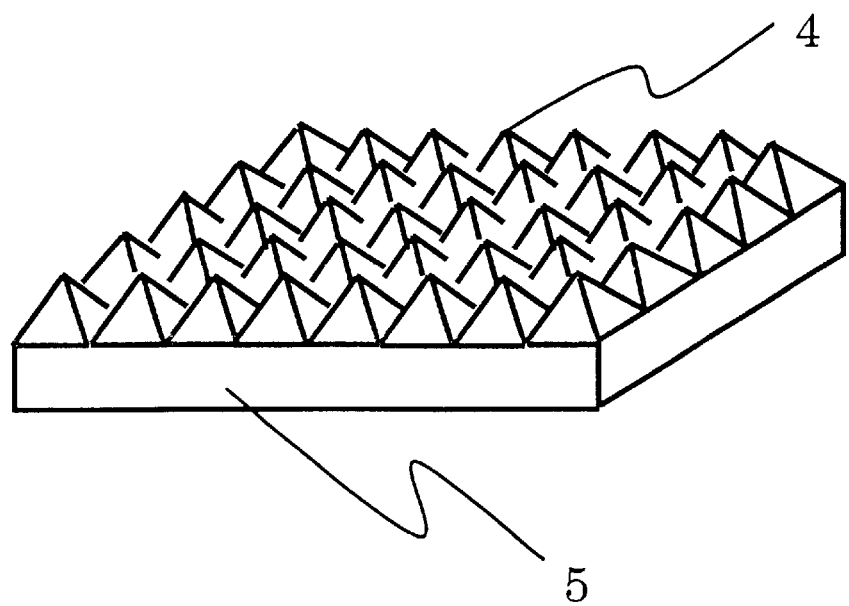
FIG. 9B is a schematic perspective view showing a base with dot-like protrusions of the present invention.
Figure 10A:
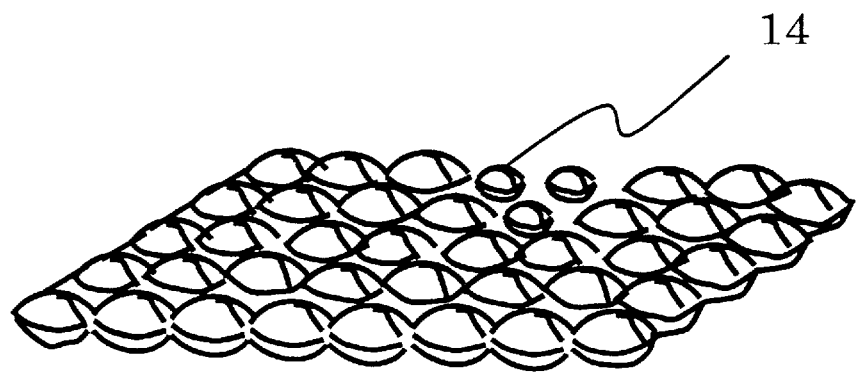
FIG. 10A is a schematic perspective view showing a sheet.
Figure 10B:
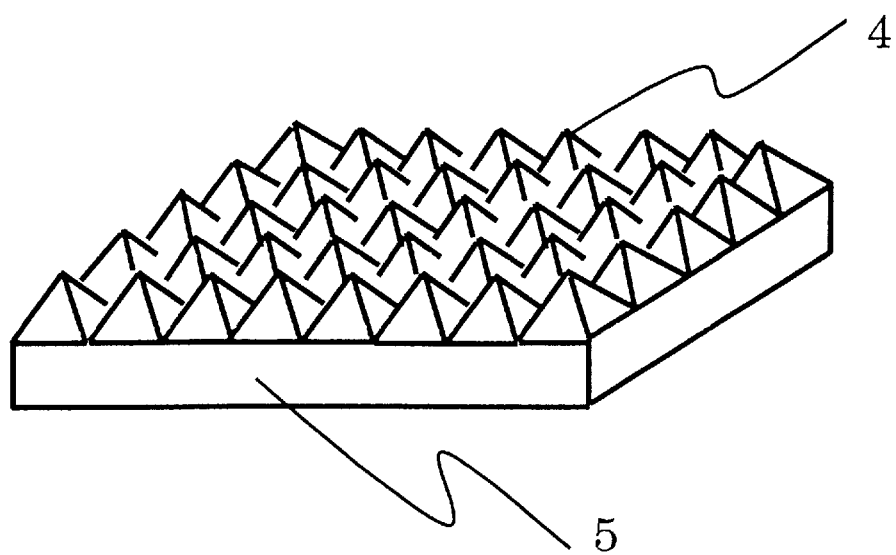
FIG. 10B is a schematic perspective view showing a base with dot-like protrusions of the present invention.

If the substrate is sufficiently cooled, the moving or rotating speed of the base is high, and the melt temperature is low, rapid crystal growth occurs after formation of crystal nuclei to produce a sheet. However, if sufficient time is not allowed before crystals grow into a sheet as when the moving speed of the base is too high, crystals grow only over the dot-like protrusions 4 as shown in FIG. 9 to produce crystals roughly in the shape of balls, or the produced sheet may partially have such ball-like portions as shown in FIG. 10, resulting in discontinuous crystal sheet.

Figure 11A:
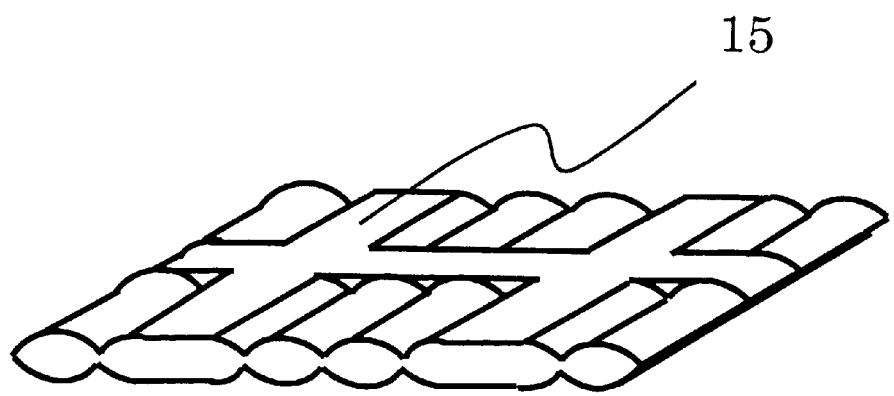
FIG. 11A is a schematic perspective view showing a sheet.
Figure 11B:
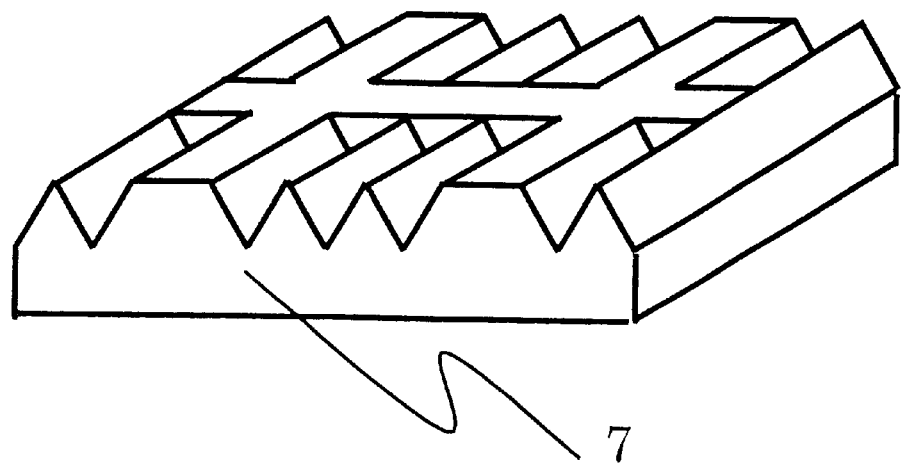
FIG. 11B is a schematic perspective view showing a base with linear and planar protrusions of the present invention.

Now, referring to FIG. 11, a sheet produced with use of base 7 of FIG. 3 will be described. FIG. 11 is a perspective view showing a positional relationship between the base with planar and linear protrusions and a sheet produced by crystal growth on the surface of the base.

A sheet 15 produced by solidification and crystal growth of the melt on the surface of base 7 has both curved and planar portions. This is because the crystals formed from the planar protrusions of the base produce a planar portion but those formed from the linear protrusions produce a curved portion. Thus, a single sheet has both planar and curved portions.

Crystal growth of the sheet on the base occurs as follows. Namely, crystal nuclei first produced on the planar and linear protrusions which are first dipped into the melt. Since the base is cooled down, crystal growth starts based on the crystal nuclei. The crystals in the planar shape from the planar protrusions and those in the curved shape from the linear protrusions combine together as they grow to produce a sheet with both planar and curved portions.

However, resultant sheet 15 would not have the shape that conforms to the protrusions as shown in FIG. 11. Sheet 15 would have a shape generally as shown in FIG. 11, depending on various factors including surface tension of the melt, temperature of the cooled base, moving or rotating speed of the base, the shape of the protrusions and the like.

Figure 12A:
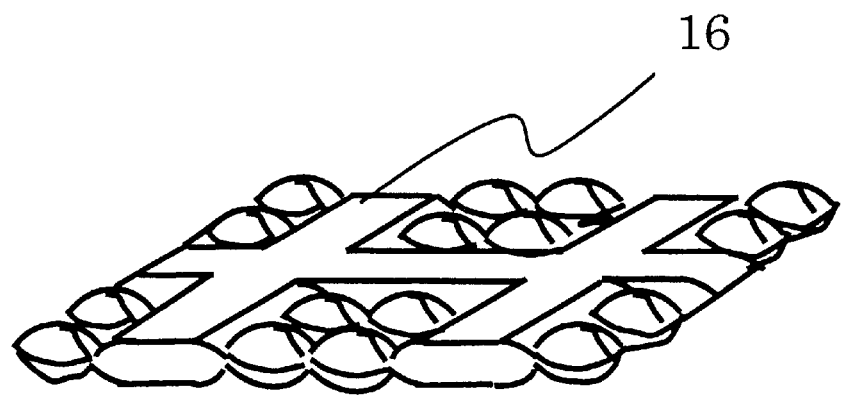
FIG. 12A is a schematic perspective view showing a sheet.
Figure 12B:
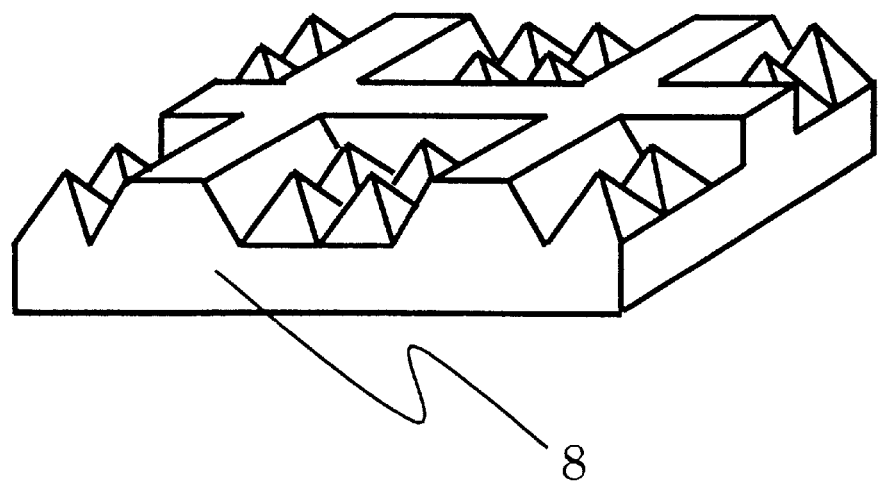
FIG. 12B is a schematic perspective view showing a base with dot-like and planar protrusions of the present invention.

In the above, the formation of the sheet with use of base 7 of FIG. 3 has been described with reference to FIG. 11. When a sheet is produced with use of base 8 of FIG. 4, crystal nuclei are first formed on the dot-like protrusions, rather than linear protrusions, as shown in FIG. 12, subsequent crystal growth is similar to the case of the base of FIG. 3.

More specifically, crystal nuclei are first formed on the cooled planar protrusions 6 and dot-like protrusions 4, and crystal growth starts based on the crystal nuclei. As crystal growth proceeds, crystals from adjacent planar protrusions 6 and dot-like protrusions 4 combine one another to form a sheet. Note that the crystals formed from the linear or dot-like protrusions are curved in shape and tend to have small grain size. Thus, it is preferred that the planar protrusions occupy a greater percentage of the base area.

In the case of bases 7 and 8 respectively illustrated in FIGS. 3 and 4, the crystals formed from the planar protrusions produce a planar portion, whereas those from the dot-like protrusions or linear protrusions produce a curved portion. Thus, a completed sheet has both curved and planar portions. Such a sheet with planar and curved portions has enhanced strength because of the planar portion.

Figure 13:
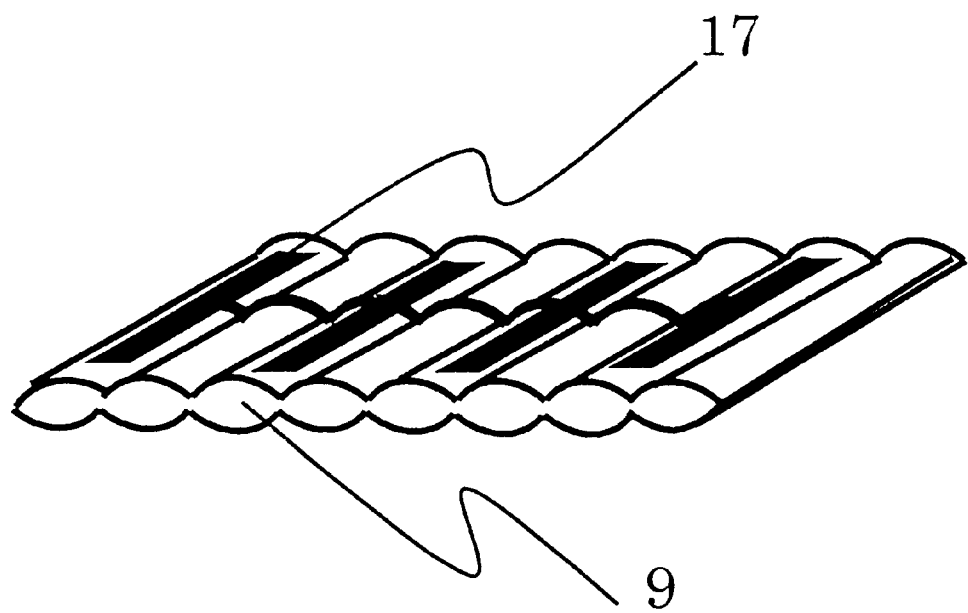
FIGS. 13 and 14 are schematic perspective views each showing a solar cell with an electrode arranged on the sheet of the present invention.
Figure 14:
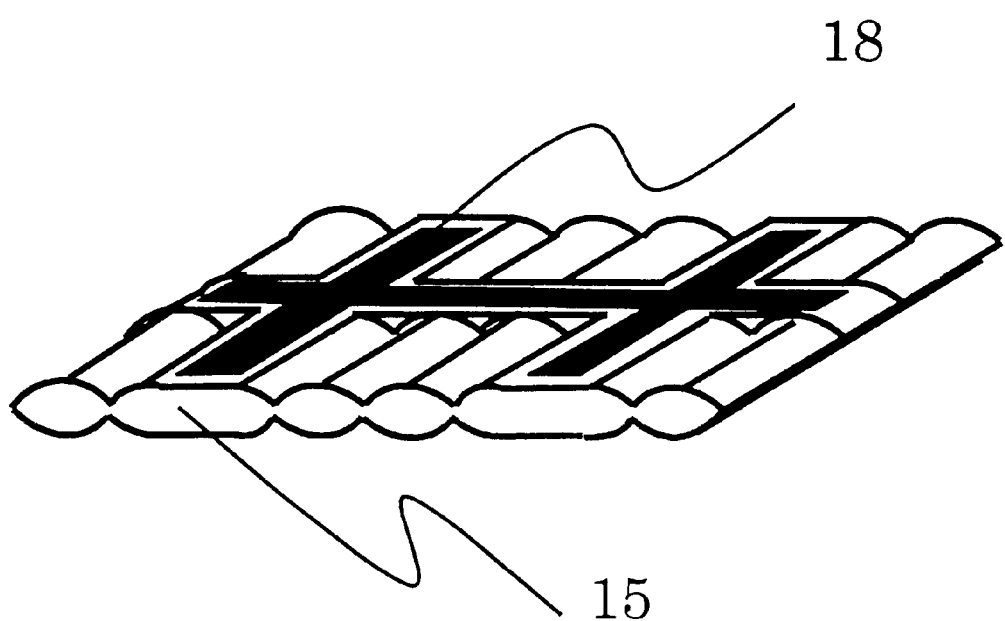

Next, a method of forming an electrode onto the resultant sheet will be described with reference to FIGS. 13 and 14. FIG. 13 is a perspective view of sheet 9 with electrode 17 formed thereon. FIG. 14 is a perspective view of a sheet with a planar portion on which an electrode 18 is formed.

FIG. 13 shows four electrodes, which are parallel to the recesses of the sheet, along with one additional electrode arranged orthogonal to these electrodes. However, the method of forming the electrode is not particularly limited to this. Namely, electrodes may be formed in the recesses of the sheet.

FIG. 14 shows electrode 18 formed on the planar portion of the sheet. Such arrangement prevents breakage of electrode 18 and, in addition, electrode 18 on sheet 15 is not large in width.

The planar protrusions of the base produce planar portions of the sheet, so that the electrode can be readily formed thereon. The method of forming the electrode may employ for example screen printing, vapor deposition or plating, while not limiting.

Reinforcing ribs of the sheet of the present invention permit usage of a method of forming an electrode with a screen mask being in contact, such as screen printing, where reduction of cost may be achieved.

When a solar cell is manufactured with use of the produced sheet, preferably, an electrode on the side of incident light (hereinafter referred to at a front electrode) is narrow, whereas a back electrode on the opposite side is formed over the entire area of the sheet. Both sides of the sheet with protrusions are similarly shaped and hence either side may be used as incident light side. However, the base side is preferably used as the back electrode side of the solar cell. This is because crystal nuclei are produced on linear, dot-like, and planar protrusions, resulting in extremely small crystal grains. Thus, a sheet manufactured by the sheet manufacturing method of the present invention is extremely effective for an electronic device which requires an electrode because the electrode can be formed directly on the planar portion.

Sheet 15 of FIG. 14 is useful in that the base for manufacturing a solar cell may have a planar portion, which will be the light incident side to have a grid-like electrode thereon. Although such a base may be manufactured from a single crystal sheet or polycrystalline sheet, such manufacture disadvantageously involves use of an oxide film, patterning by application of resist or the like, and further removal of any unwanted portion by etching. In addition, the sheet produced by the present invention is polycrystalline and hence includes crystal grains of various plane directions. Such variation in plane directions results in variation in etching speed during patterning, and therefore it is difficult to produce a sheet by the steps shown in conjunction with FIGS. 5 to 14. In the sheet manufacturing method of the present invention, an inexpensive sheet in a shape as shown in FIGS. 5 to 14 is produced from the melt.

Here, detailed description of the protrusions of the base is given. Referring to FIG. 1, a space between adjacent linear protrusions 2 of base 1 is not particularly limited. However, a constant pitch of linear protrusions 2 provides better uniformity of the sheet and is therefore more preferable. Even if the pitches of linear protrusions 2 are irregular, uniformity and evenness may be ensured by formation of the planar protrusions as shown in FIG. 3 or a relatively large width (area) of the planar protrusion. By appropriately determining the pitch of the linear protrusions, presence/absence of the planar protrusions, and the width (area) of the planar protrusions, uniformity is controlled and the sheet in a desired shape can be obtained. Similarly, in the case of FIGS. 2 and 4, by appropriately determining the pitch of the linear protrusions, presence/absence of the planar protrusions, and the width (area) of the planar protrusions, uniformity is controlled and the sheet in a desired shape can be obtained.

The space between the adjacent protrusions significantly governs removability of the base from the sheet. Namely, if the pitch of the linear protrusions is too small, the sheet is in contact with the base over a greater area, whereby removal of the sheet from the base requires greater force. On the other hand, if the pitch of the adjacent linear protrusions is too large, a relatively long time is required to allow crystal to grow on the base. To reduce the time required for crystal growth, the base temperature, melt temperature or the moving speed of the base must be decreased. As a result, productivity decreases. Note that the pitch of the adjacent dot-like protrusions significantly governs removability of the sheet from the base.

Although the pitch of the adjacent planar protrusions 6 as shown in FIGS. 3 and 4 is not particularly limited, greater width (area) of planar protrusions 6 provides better evenness of the sheet. On the other hand, relatively large width (area) of planar protrusions 6 tends to decrease removability of the sheet from the base, and therefore the width (area) of planar protrusions 6 must be properly selected. Although bases of FIGS. 3 and 4 have linear or dot-like protrusions between the adjacent planar protrusions 6, the numbers thereof are not particularly limited, and the protrusions can be designed as appropriate considering evenness, removability or the like.

When a solar cell is to be manufactured from the resultant sheet, the pitch of the linear protrusions is preferably at least 0.05 mm. The pitch of the dot-like protrusions is also preferably at least 0.05 mm. A pitch less than 0.05 mm results in disadvantageously small crystal grains that impair the properties of the solar cell, and is not desirable.

Figure 15:
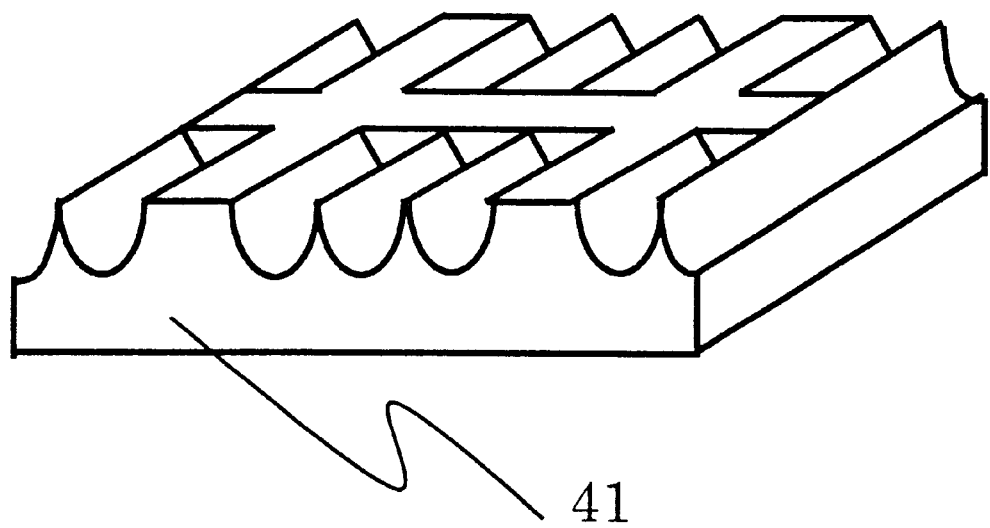
FIGS. 15 to 17 are perspective views each showing a base with linear and planar protrusions of the present invention.
Figure 16:
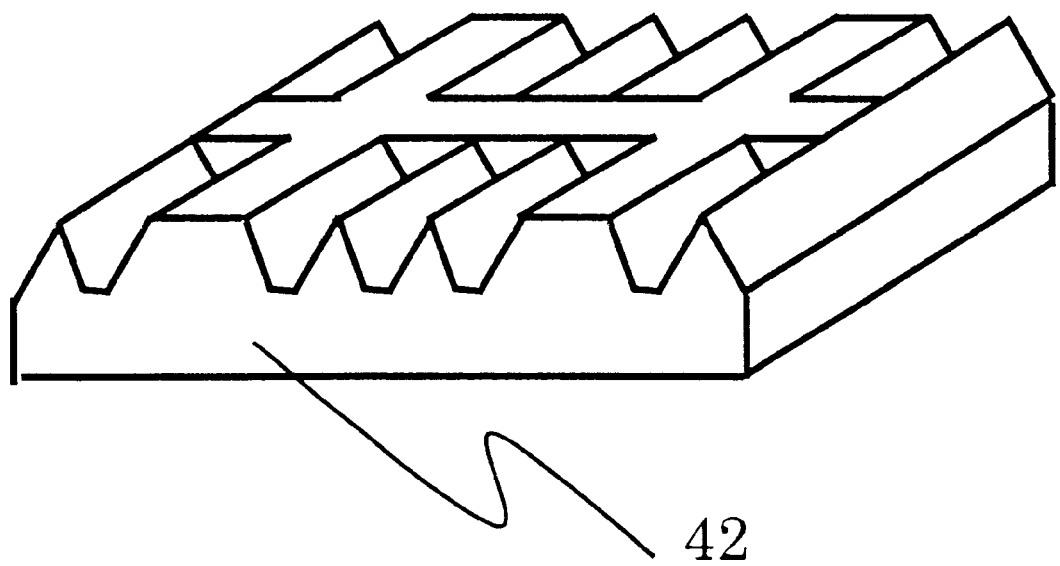
Figure 17:
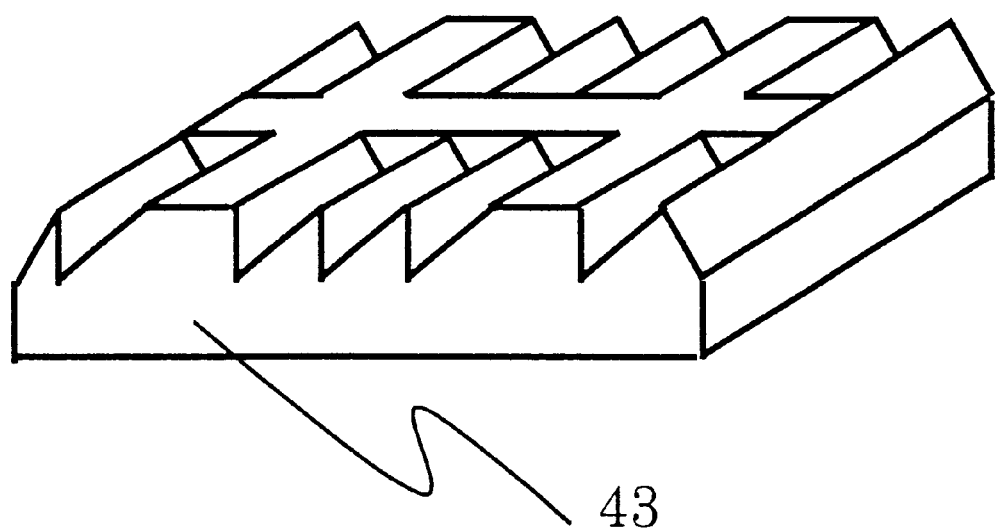

Although the recesses shown in FIGS. 1 to 4 are in the shape of V like grooves, the recesses may be in the shape of V as shown in FIGS. 15 to 17, U, trapezoid, oblique groove and the like, and are not particularly limited. Bases having linear and linear protrusions with U grooves, trapezoidal grooves and oblique grooves are respectively denoted by reference numerals 41, 42 and 43. The depth of the groove is at least 0.05 mm and, more preferably, at least 0.1 mm. A depth of the groove less than 0.05 mm would make it difficult to remove the produced sheet from the base due to crystal growth at the groove. However, the depth of the groove must be appropriately selected in consideration of the structure of the base and the melt material since surface tension of the melt material may also determine the resulting effect. Although the grooves are shown in the drawing as having the same depth, they may have different depths. This is because the temperature more or less varies over the surface of the base according to the depth of the groove when the base is cooled. Thus, the surface shape and the depth of the groove must be appropriately determined for temperature control.

Further, although planar protrusions 6 are arranged orthogonally in FIGS. 3 and 4, they may not be orthogonal. FIGS. 18 to 23 show schematic illustrations of a sheet obtained when the planar protrusions are not orthogonally arranged. Bases with protrusions are denoted by 44, 46, 48, 50, 52, and 54, whereas sheets resulting from these bases are denoted by 45, 47, 49, 51, 53 and 55.

Figure 18A:
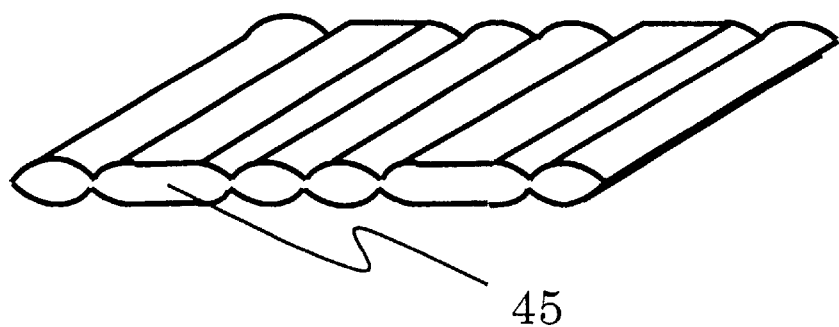
FIG. 18A is a schematic perspective view showing a sheet.
Figure 18B:
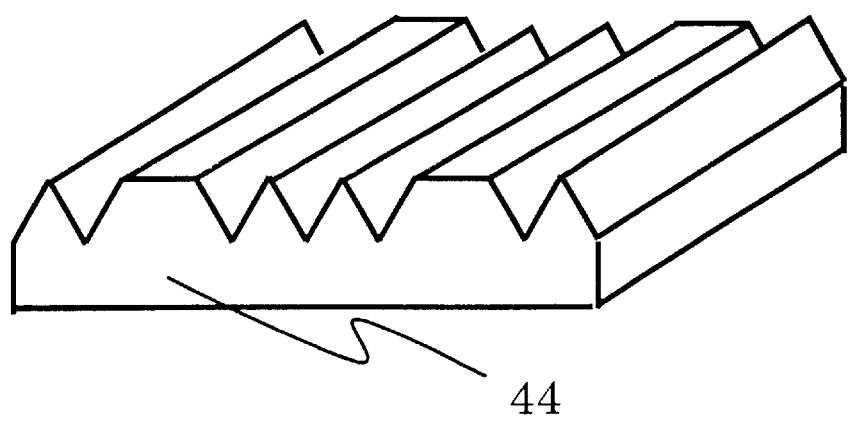
FIG. 18B is a schematic perspective view showing a base with linear and planar protrusions of the present invention.
Figure 19A:
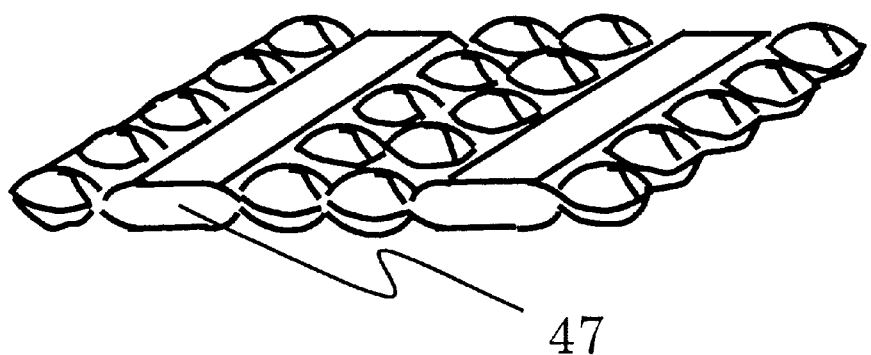
FIG. 19A is a schematic perspective view showing a sheet.
Figure 19B:
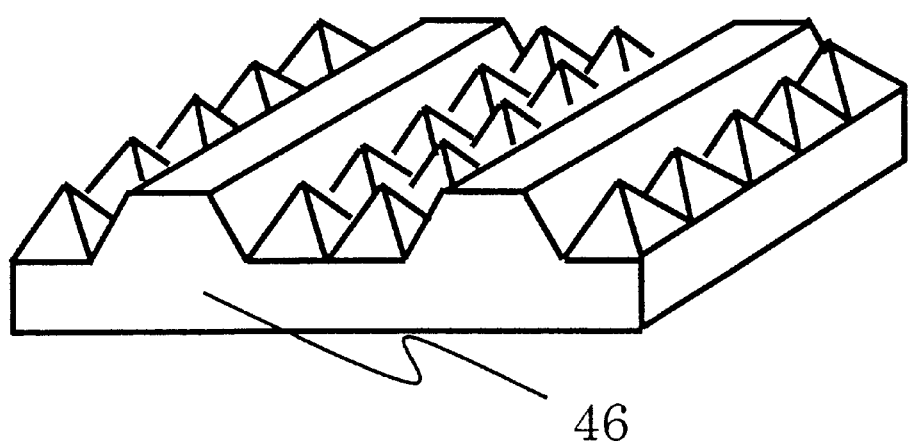
FIG. 19B is a schematic perspective view showing a base with dot-like and planar protrusions of the present invention.
Figure 20A:
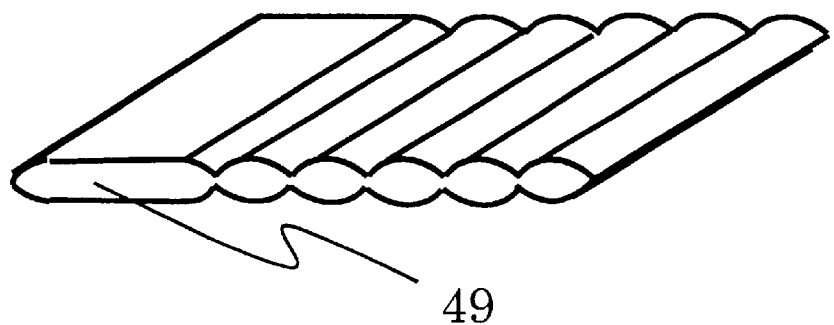
FIG. 20A is a schematic perspective view showing a sheet.
Figure 20B:
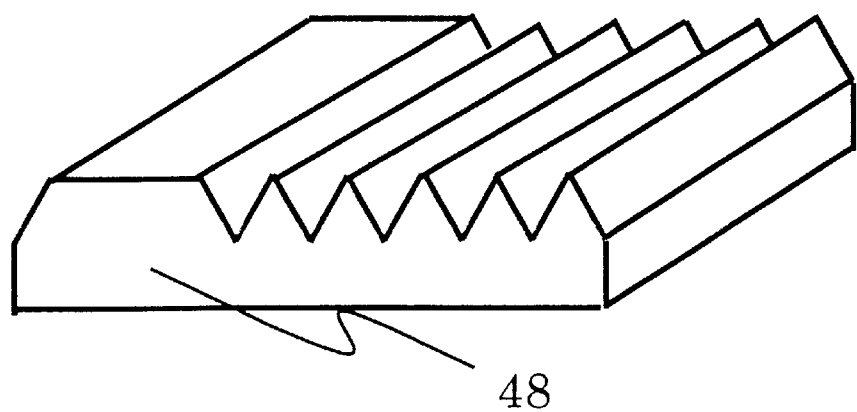
FIG. 20B is a schematic perspective view showing a base with linear and planar protrusions of the present invention.
Figure 21A:
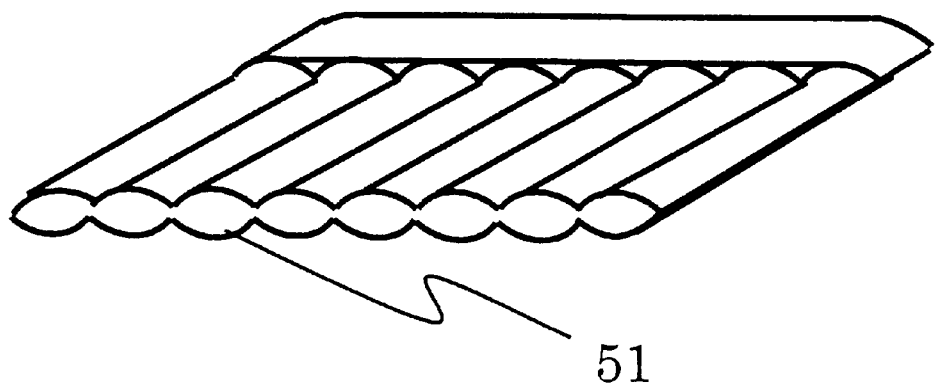
FIG. 21A is a schematic perspective view showing a sheet.
Figure 21B:
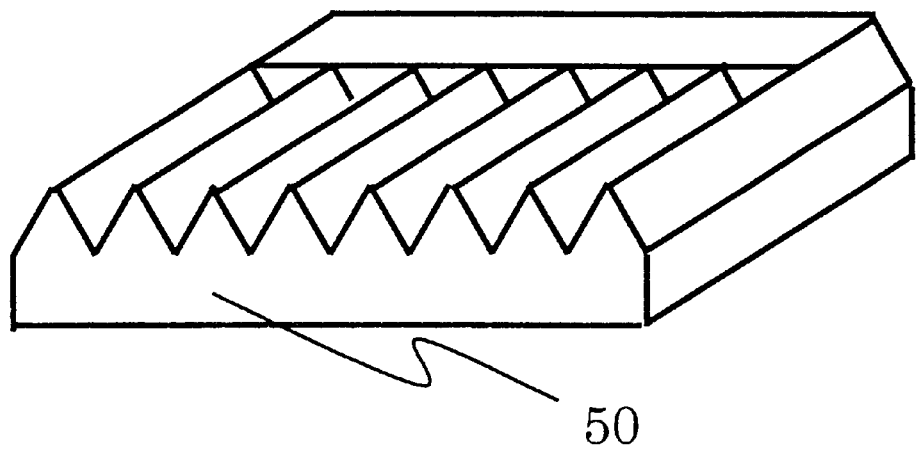
FIG. 21B is a schematic perspective view showing a base with linear and planar protrusions of the present invention.
Figure 22A:
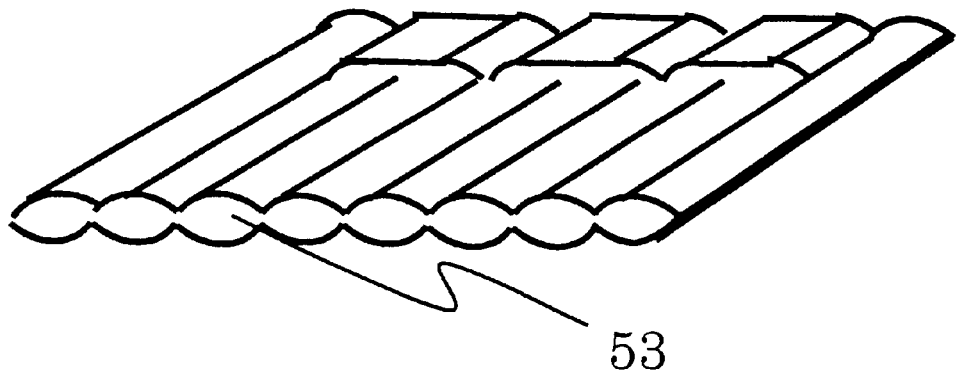
FIG. 22A is a schematic perspective view showing a sheet.
Figure 22B:
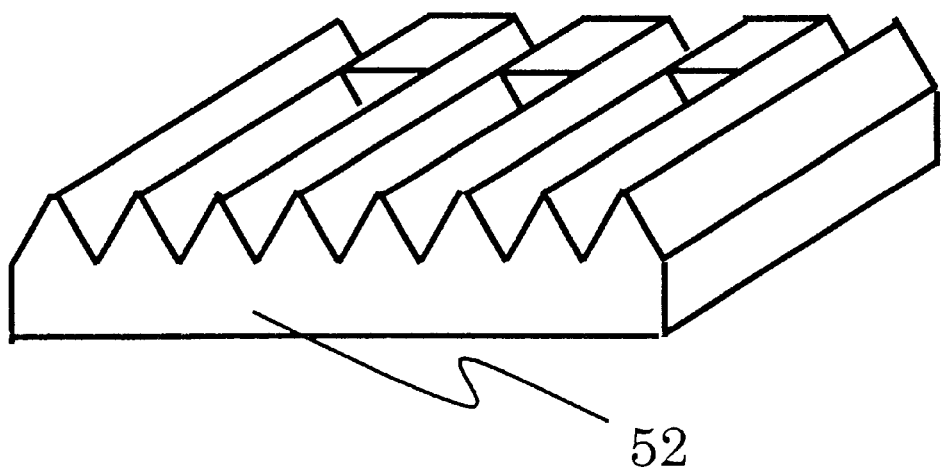
FIG. 22B is a schematic perspective view showing a base with linear and planar protrusions of the present invention.
Figure 23A:
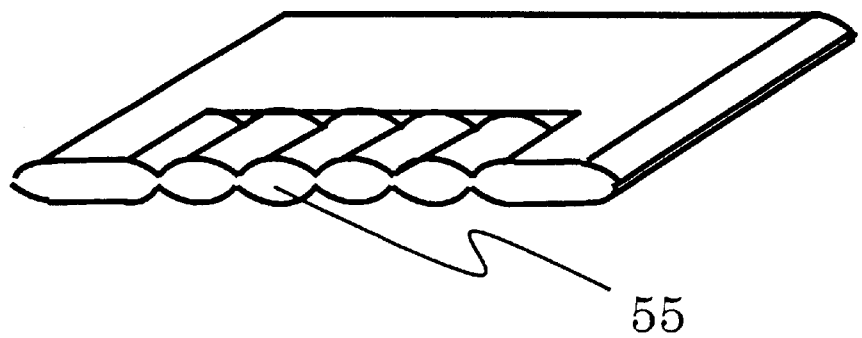
FIG. 23A is a schematic perspective view showing a sheet.
Figure 23B:
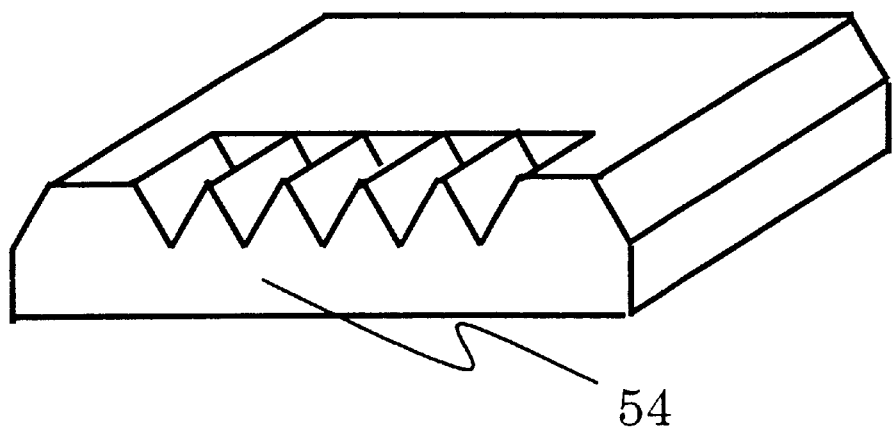
FIG. 23B schematic perspective view showing a base with linear and planar protrusions of the present invention.

The planar protrusions may be arranged in parallel as shown in FIGS. 18 and 19. They may be arranged in parallel with the grooves as shown in FIG. 20. They may be formed orthogonally to the grooves as shown in FIGS. 21 and 22. Grooves may be partially formed as shown in FIG. 23. When a solar cell is to be produced from the sheet having a large area, it is preferred that the planar protrusions are orthogonally arranged. This is because the maximum possible current must be derived to improve the properties of the solar cell. More specifically, orthogonal arrangement of a bus bar electrode (main electrode) and a finger electrode (sub electrode) facilitates designing to reduce series resistance. Thus, it is preferred that the width of the planar protrusion is designed to reduce the series resistance. Namely, preferably, the portion to be the bus bar electrode has a larger width, whereas the portion to be the finger electrode has a smaller width. Thus, a solar cell with improved properties can be obtained by appropriately determining the width of the planar protrusion according to the purpose.

As stated above, the protrusions of the base act as basis for crystal growth of the sheet, and crystal growth depends on the shape, width and pitch of the protrusions, the melt material, the melt temperature, base material, base temperature and the like. Therefore, it is preferable that these factors are appropriately determined.

By preliminary determining the shapes of the protrusions of the base, distribution of crystal nuclei as a basis for crystal growth can be controlled, whereby a sheet with excellent evenness and removability is produced.

Preferably, a material with excellent heat conductivity and heat resistance is used for the base with protrusions. Examples of materials used for the base include high-purity graphite, silicon carbide, quartz, boron nitride, alumina, zirconium oxide, and metal. The optimum material may be selected according to the melt used.

High-purity graphite is more preferable because of its inexpensiveness and workability, which facilitate formation of protrusions. The material for the base can be appropriately selected by considering industrial inexpensiveness, various properties such as a base property of the produced sheet and the like, for determining the combination of the melt material and the base. Metal may be used for the base without causing any problem, as long as constant cooling is maintained, temperature of the metal is maintained below a melting point of the base, and it does not adversely affect the properties of the sheet.

Generally, the base can be cooled either by direct or indirect cooling. For direct cooling, a base is directly cooled by gas. For indirect cooling, the base is indirectly cooled by gas or melt. Although the type of the coolant gas is not particularly limited, for the purpose of preventing oxidation of the sheet, inert gas such as nitrogen, argon, or helium is preferred. Helium or mixture gas of helium and nitrogen is preferred particularly in terms of cooling ability, but nitrogen is preferable in terms of cost. The coolant gas is circulated with use of a heat exchanger or the like, for cost reduction.

Now, a sheet manufacturing apparatus using a base with protrusions will be described. Referring to a schematic diagram of FIG. 24 showing a sheet manufacturing apparatus for horizontal pulling method, a method of forming a sheet onto a continuous base having continuously arranged bases will be described.

Figure 24:
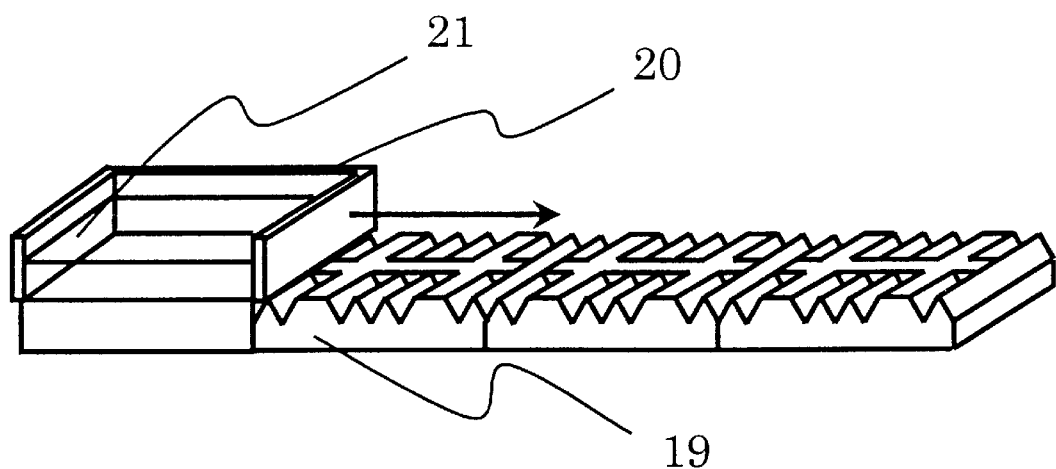
FIG. 24 is a schematic perspective view showing a sheet manufacturing apparatus which employs a horizontal pulling method of the present invention.

Referring to FIG. 24, a continuous base having protrusions is denoted by 19, a crucible by 20, and a melt by 21. The melt in the crucible is heated to at least a melting point by a heater and maintained in a stable melt state. Examples of the melt include semiconductor materials such as silicon, germanium, gallium, arsenic, indium, phosphorus, boron, antimony, zinc, tin, or a melt including metal material such as aluminum, nickel, or iron.

The bottom of crucible 20 has an opening, through which melt 21 can be continuously supplied onto continuous base 19. Crystals grow on continuous base 19 to form a sheet. By controlling the moving speed of the crucible, temperature of the continuous base, the melt temperature or the like, the thickness of the sheet can readily be controlled.

Figure 25:
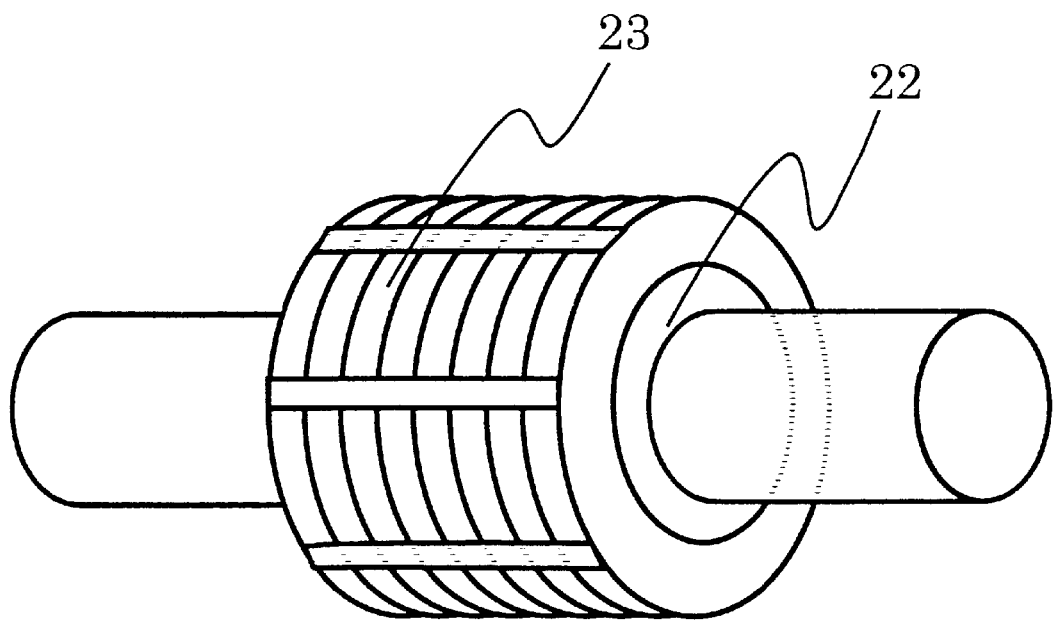
FIG. 25 is a schematic perspective view showing a sheet manufacturing apparatus which employs a rotation method of the present invention.

A method of forming a sheet onto a base when a cooling roller method is employed will be described with reference to FIG. 25. FIG. 25 is a schematic diagram showing a sheet manufacturing apparatus provided with a movable roller. A movable roller is denoted by 22, and protrusions in the surface thereof are denoted by 23. The protrusions include both linear and planar protrusions here. Although the roller is shown as having protrusions in its surface, these protrusions may be removably attached to the surface of the roller. Protrusions extend outwardly with respect to a rotation axis of the roller on the peripheral surface of the roller.

Figure 26:
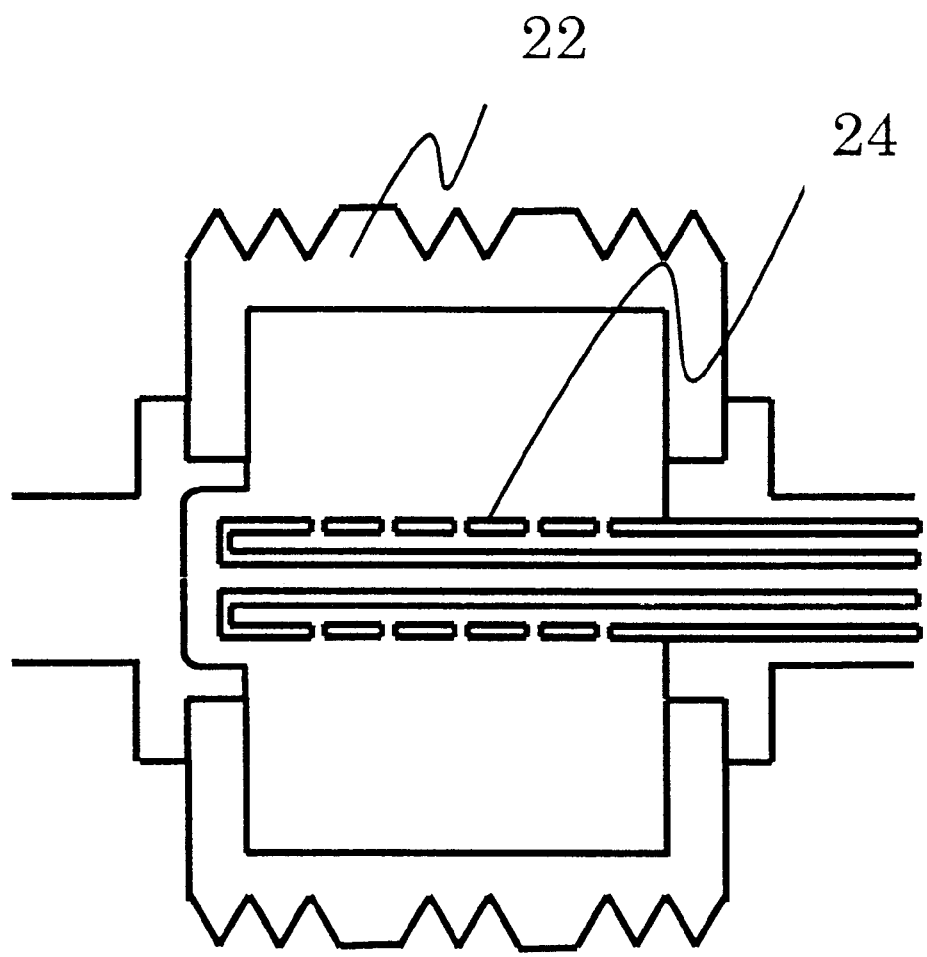
FIG. 26 is a cross sectional view showing a sheet manufacturing apparatus provided with a cooling portion of the present invention.

An internal structure of the roller in FIG. 25 will be described with reference to FIG. 26. FIG. 26 is a cross sectional view showing a cooling portion of the sheet manufacturing apparatus with a roller having the cooling system. Coolant gas nozzle is denoted by 24. Coolant gas nozzle 24 serves to gradually cool from inside roller 22, for indirectly cooling protrusions in the surface of roller 22. Such indirect cooling of protrusions enables continuous production of the sheet. A cooling means inside roller 22 may be any means so long as it uniformly cools the base mounted on the roller. Namely, a structure of cooling by gas or melt is preferred.

Figure 31:
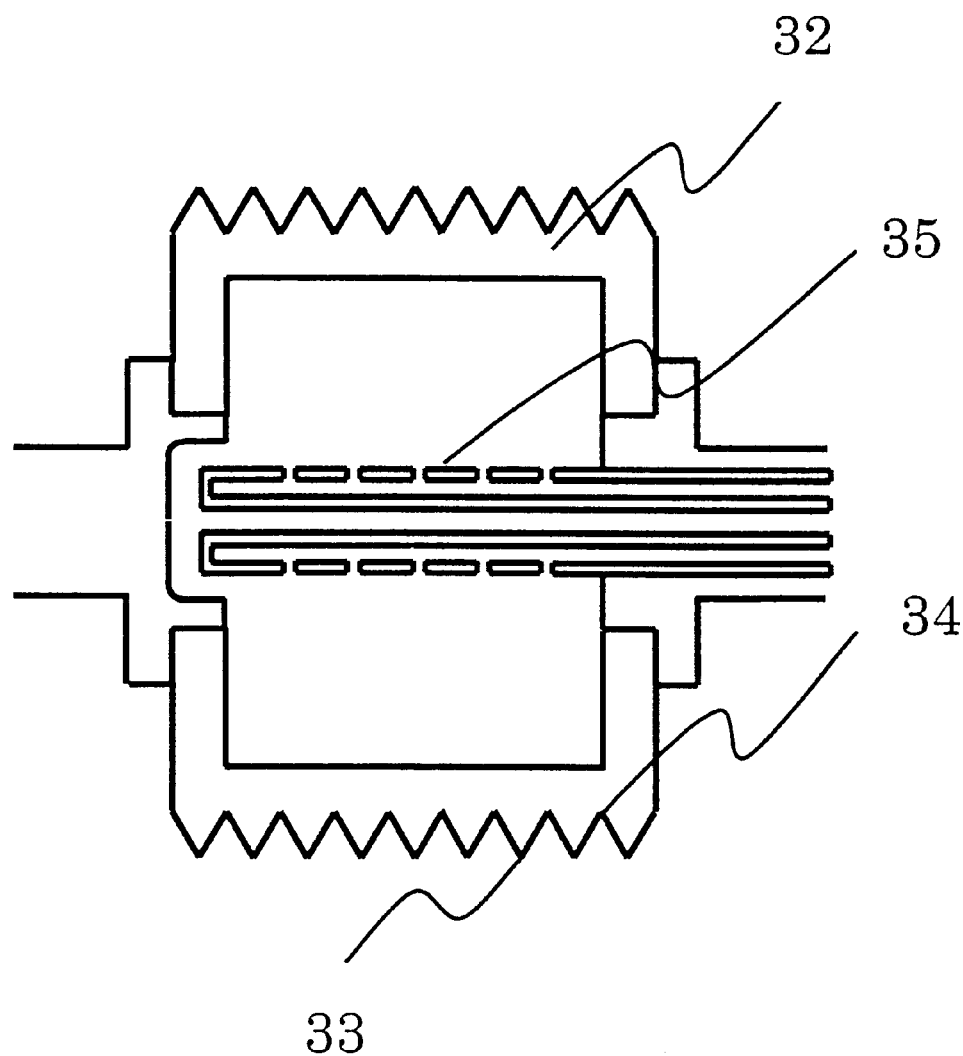
FIG. 31 is a cross sectional view showing the sheet manufacturing apparatus provided with a cooling portion of the present invention.

Preferably, inert gas such as nitrogen, argon, or helium is used as coolant gas. While helium or mixture gas of helium and nitrogen is preferred in terms of cooling ability, nitrogen is more preferable in terms of cost. Further, coolant gas or water is circulated with use of a heat exchanger or the like for cost reduction. Although the surface structure having linear and planar protrusions has been described with reference to FIGS. 25 and 26, only linear protrusions may be formed as shown in FIG. 31. Further, the protrusions of the base may be as shown in any of FIGS. 1 to 4 and FIGS. 15 to 23.

In the above, the structure of the surface of the roller has been described. Any structure may be employed so long as protrusions are formed on the side for crystal growth of the sheet. As shown in FIGS. 26 and 31, protrusions need only be formed in the surface of the roller. FIG. 26 shows linear and planar protrusions formed in the surface, whereas FIG. 31 shows only linear protrusions formed in the surface. While not shown in the drawings, dot-like protrusions may be formed.

The cooling roller, being cylindrical in shape, has been described in the above. Now, polygonal cooling roller will be described. In this case, since the side for crystal growth is planar, a planar sheet is obtained. Thus, a polygonal roller is extremely effective for the purpose of manufacturing solar cells.

Figure 27:
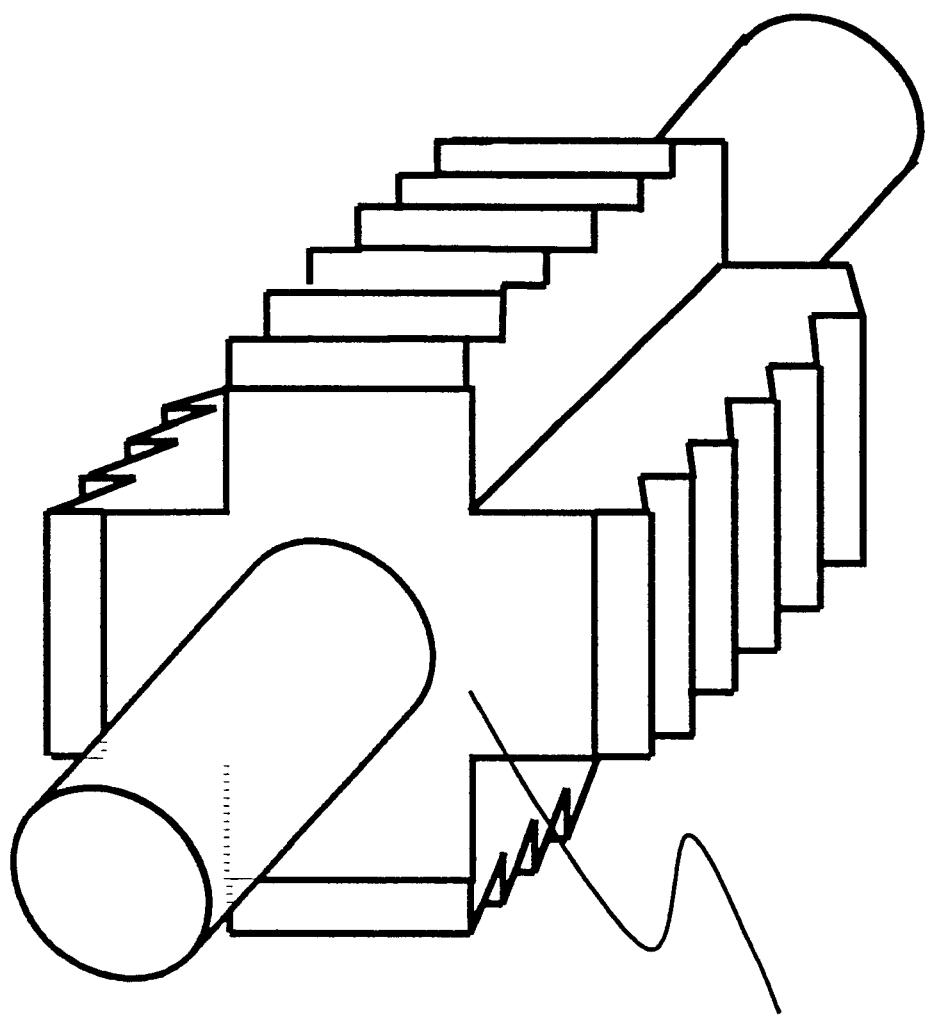
FIGS. 27 to 29 are schematic perspective views each showing a sheet manufacturing apparatus provided with a cooling portion of the present invention.

FIG. 27 is a schematic diagram showing a sheet manufacturing apparatus provided with a movable polygonal roller. The roller with linear protrusions is denoted by 56. Although the roller is shown as having four sides adapted to be used for crystal growth of the sheet, the roller may not necessarily have four sides. In terms of productivity, a roller with a large diameter is preferably employed so that one rotation provides a plurality of sheets. FIG. 27 shows linear protrusions formed on the roller having planar surfaces. In this case, the linear protrusions are arranged in the rotation direction of the roller.

Figure 28:
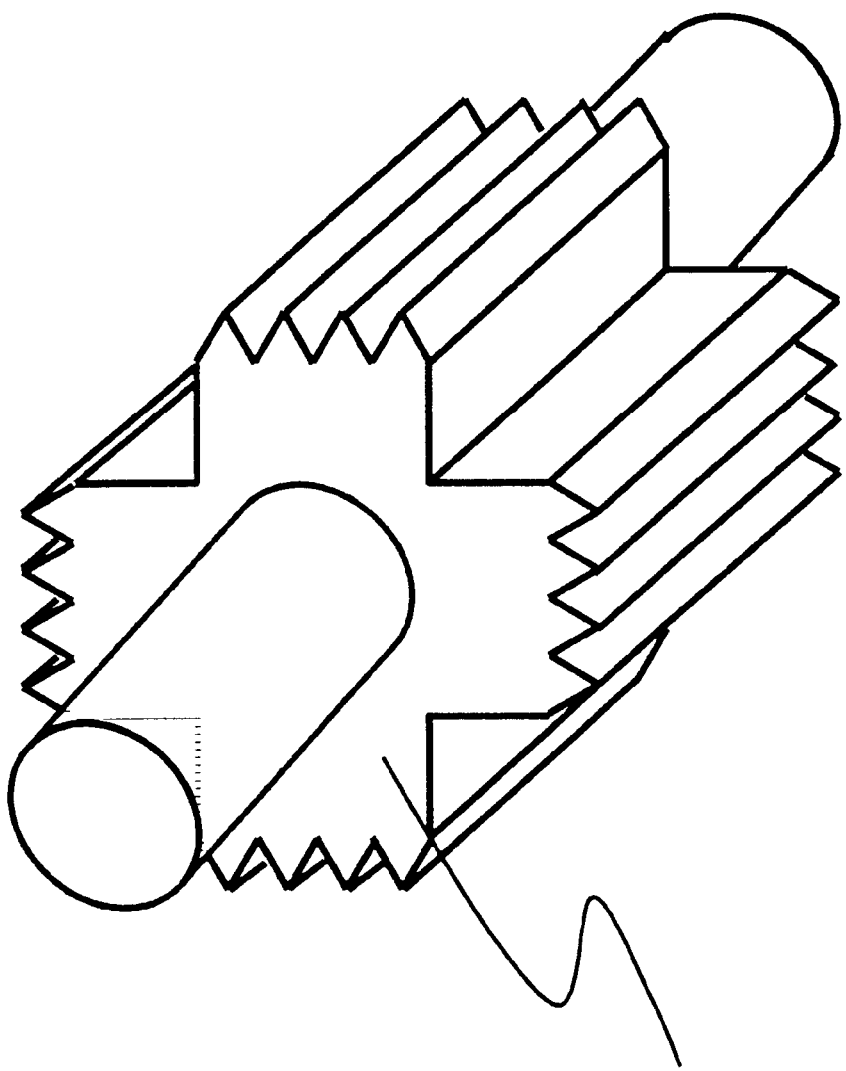
Figure 36:
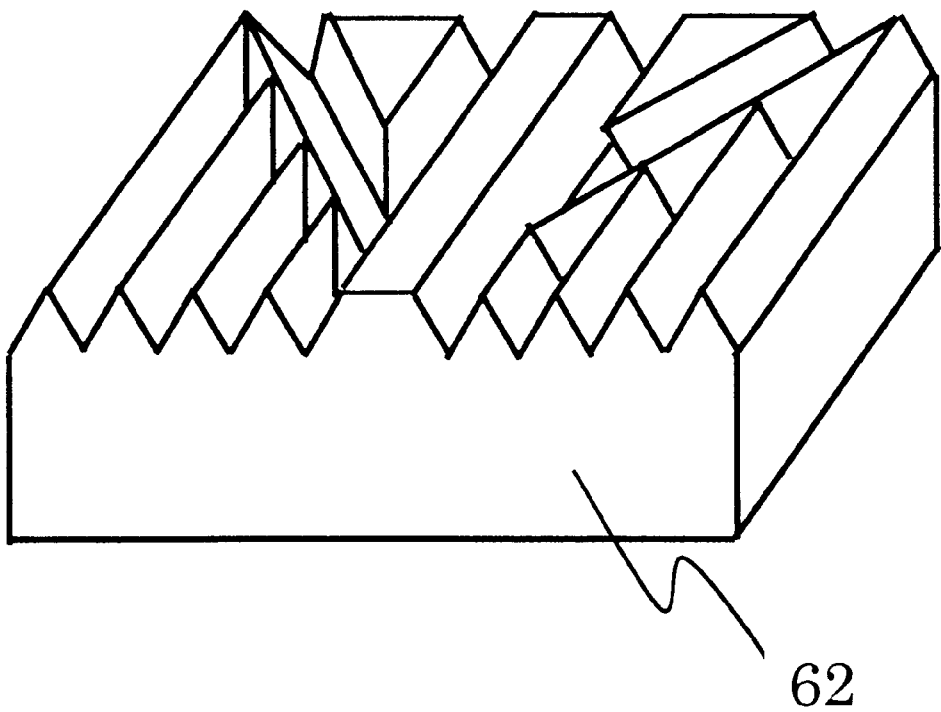
FIG. 36 is a perspective view showing a base with linear and planar protrusions of the present invention.

FIG. 28 shows linear protrusions formed orthogonal with respect to the rotation direction of the roller. A roller with linear protrusions is denoted by 57. When a sheet is to be formed on the linear protrusions, such linear protrusions are preferably formed in the same direction as the rotation direction of the roller. If the linear protrusions are in the rotation direction, the melt more easily spread over the surface of the base with protrusions. In other words, the melt can move smoothly over the surface, thereby preventing formation of a rough sheet due to thickened melt not spread smoothly. Further, to prevent formation of rough sheet, the grooves may be formed such that protrusions converge in one point to collect the melt. As shown in FIG. 36, for example, the oblique grooves collect the melt at the central portion.

The above described polygonal roller may have protrusions in the base as shown in any of FIGS. 1 to 4 and FIGS. 15 to 23. Even in the case of FIG. 28, a sheet can be manufactured without having any protrusions. This is because the grooves in the surface as well as the spaces between the planar sides of the polygonal body can be controlled to provide desired shapes.

As described above, when the base with protrusions is moved (FIGS. 25 to 28 and FIG. 31) or when the crucible is moved with the base fixed (FIG. 24), the shapes of the protrusions in the base can be designed in consideration of the shape of the sheet to be produced, regardless of whether or not the base moves.

A high-purity coating may be applied to the surface of the base with protrusions. Further, a high-purity coating may be applied to the surfaces of the protrusions. Preferably, the coating material includes at least one of silicon carbide (SiC), boron nitride (BN) silicon nitride (SiNx), and pyrolitic carbon. Namely, the presence of the high-purity coating on the surface of the base prevents contamination of the sheet. When silicon is used as the melt, in particular, silicon carbide, silicon nitride, pyrolitic carbon or the like can be used. In other words, a coating containing at least one material on the protrusions can prevent the melt from being poured into the grooves of the protrusions. A material with low wettability with respect to the silicon melt prevents such melt from entering the grooves. Even in the case of a material with high wettability with respect to the silicon melt such as pyrolitic carbon, if the material is formed in layers, the sheet can be readily removed from the base even under the condition that the sheet adheres to the planar surface, because of the protrusions in the surface of the base and the layered structure.

Although the surface is coated with at least one material, preferably, thermal expansion coefficients of these materials do not differ largely. This is because the difference in thermal expansion coefficient between the surface of the base to be subjected to high temperature and the base to be cooled may cause a coating to come off.

As described above, a high-quality sheet can be obtained by appropriately controlling the material or thickness of the coating on the surfaces of the protrusions. The sheet thus formed can be cut to have a desired size (length) with use of a microcutter, YAG laser or the like, or directly used as it is.

Figure 29:
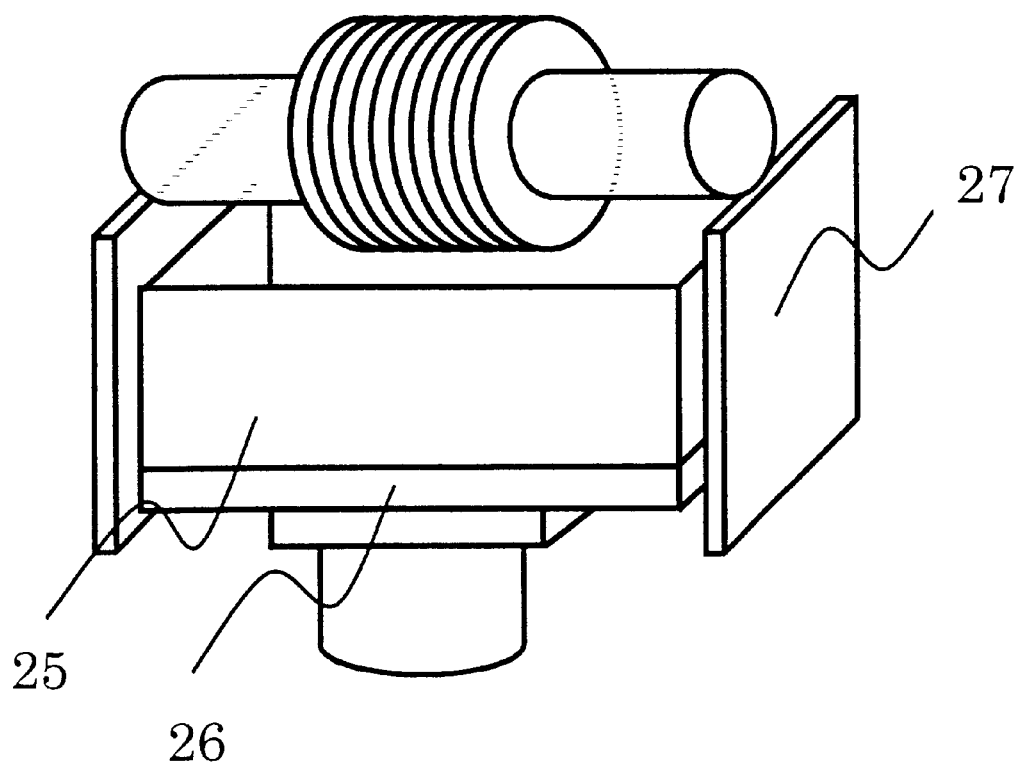

Now, referring to FIG. 29 which shows a schematic diagram of an internal portion of the sheet manufacturing apparatus with the roller, the sheet manufacturing method will be described. A crucible is denoted by 25, a crucible table with an elevator is denoted by 26, and a heater for temperature adjustment is denoted by 27. Crucible 25 containing the melt is disposed on crucible table 26. The roller having a cooling portion is arranged above the crucible table. In the drawing, it can be seen that linear protrusions are formed in the rotation direction in the surface of the roller so as to be dipped into the melt in the crucible.

Figure 30:
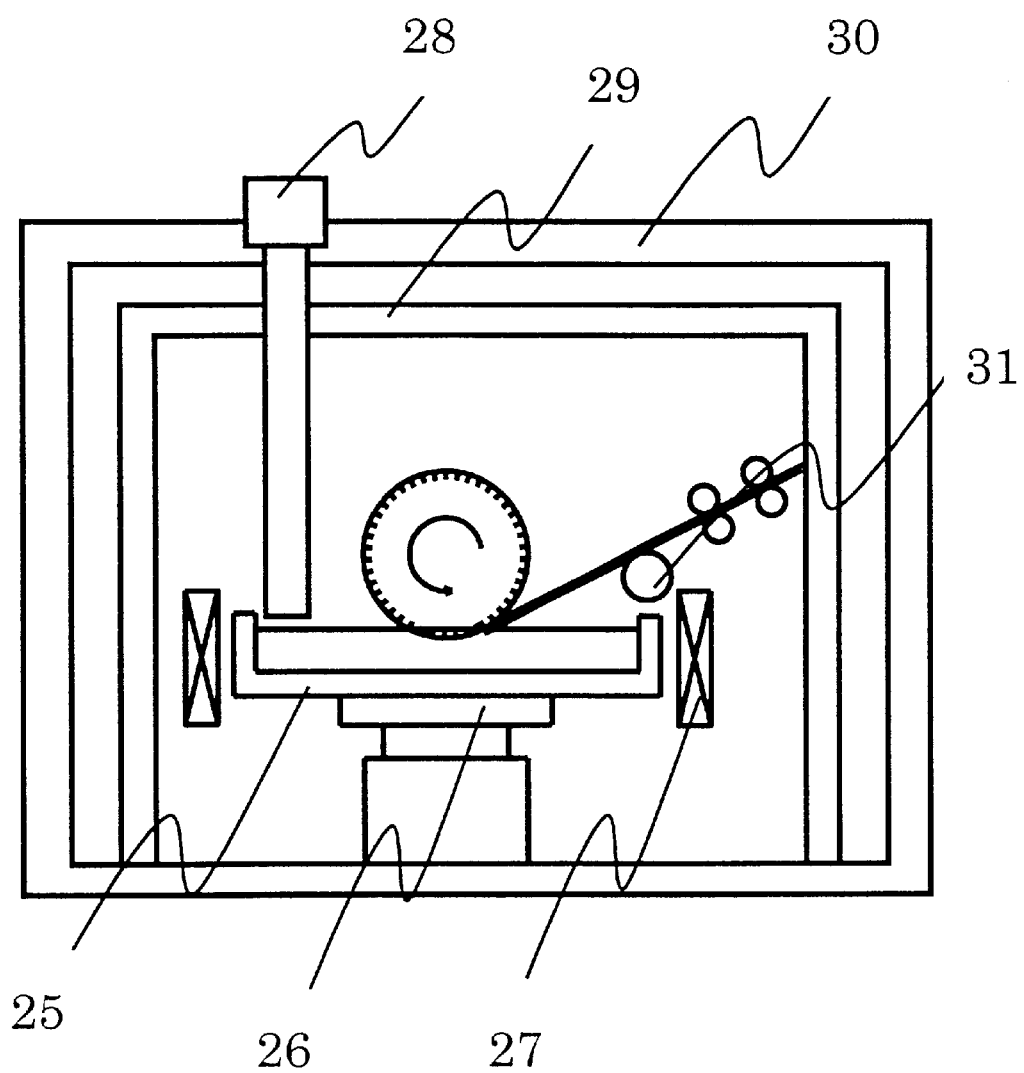
FIG. 30 is a cross sectional view showing a general structure of the sheet manufacturing apparatus of the present invention.

Referring now to FIG. 30 of a schematic diagram which shows the sheet manufacturing apparatus, the method of manufacturing the sheet will be described. A pipe for additionally introducing material, a heat-resisting material, a chamber, and a guide roller for transportation of sheet are respectively denoted by 28, 29, 30, and 31. Although a cylindrical roller is employed herein, a polygonal roller as shown in FIGS. 27 and 28 may be employed. Further, the surface structure of the roller may be as shown in any of FIGS. 1 to 4 and FIGS. 15 to 23.

The sheet manufacturing apparatus is provided in a tightly closed chamber 30 and gas exchange is performed with use of inert gas after evacuation. Examples of the inert gas are argon and helium, where argon is more preferable in terms of cost.

Preferably, heat-resisting material 29 and a plurality of heaters for temperature adjustment 27 are arranged in chamber 30 to accurately control the melt temperature. Accurate control of the ambient temperature in chamber 30 and the melt temperature enables the sheets to be produced stably with higher reproducibility. The temperature of the melt is, preferably, at least the melting point of the metal material or the semiconductor material. If the temperature of the melt is near the melting point, when the cooled base is dipped in the melt, the melt surface may be coagulated.

Although crucible 25 containing the melt is placed on crucible table 26, crucible table 26 is preferably provided with an elevator, so as to maintain the base in the melt at the same depth for forming the sheet on the base.

For maintaining the surface of the melt at the same level, polycrystalline body of the same material as the melt is molten or powder is sequentially added with use of pipe 28. However, the method of maintaining the level of the melt is not particularly limited. Note that fluctuation of the surface of the melt should be minimized. This is because the fluctuation of the surface of the melt may impair uniformity of the resultant sheet.

The present invention will be further described in detail with reference to FIG. 31. The apparatus of the present invention is suitable for use in manufacturing a silicon sheet. FIG. 31 is a cross sectional view of a cooling roller of the present embodiment. The cooling roller of the present embodiment has protrusions in its surface. The protrusions are in the shape of V or U groove, and arranged in a dot-like pattern or a linear pattern. The silicon sheet is produced from the protrusions by solidification and crystal growth, and can be readily and continuously pulled out. The detailed description is given in the following.

Referring to FIG. 31, reference numerals 32, 33, 34, and 35 respectively denote a cooling roller, a peak of the V groove of the cooling roller (a top portion of the protrusion of the cooling roller), a trough of the V groove, and gas nozzle for introducing coolant gas. Any material can be used for cooling roller 32 if it has resistance to high temperature. Examples of the material include molds of high-purity carbon, fire-resisting ceramics, silicon nitride, and boron nitride. The carbon material is, preferably, inexpensive and has high workability. A metal material may also used for cooling roller 32. Any material may be used without any problem, which has a melting point higher than that of silicon and which does not adversely affect the semiconductor properties of the resultant silicon sheet. Even when the metal material has a melting point lower than that of silicon, if coolant gas or water is supplied to maintain the temperature below the melting point of that metal, such metal material can be used without causing any particular problem. A plurality of peaks 33 of V grooves are arranged in an annular manner in the surface of cooling roller 32, having a prescribed pitch and depth. The cooling roller has a hollow shape for the coolant gas or water.

Gas nozzle 35 is coaxially provided inside cooling roller 32, which is adapted to direct externally supplied coolant gas toward the peaks 33 of V grooves. Although the type of the coolant gas is not particularly limited since it is not brought into direct contact with the silicon melt, preferably, the coolant gas is an inert gas such as $N_2$, He, or Ar. He or a mixture of He and $N_2$ is preferable in terms of cooling ability, whereas $N_2$ is preferable in terms of cost. After cooling roller 1 from inside, the coolant gas is exhausted. However, preferably, the evacuated gas after cooling roller 1 may be circulated by an externally provided heat exchanger (not shown) for further reduction of cost.

As described above, cooling roller 32 of the present embodiment has in its surface V grooves as shown in FIG. 31. Greater thickness of the peaks and troughs of the V grooves of cooling roller 32 may provide enhanced cooling effect. Note that a greater surface area, for example achieved by provision of protrusions inside cooling roller 32, can further enhance cooling effect. Namely, it is preferable to increase the contact area of the coolant gas by providing protrusions inside cooling roller 32.

Figure 32:
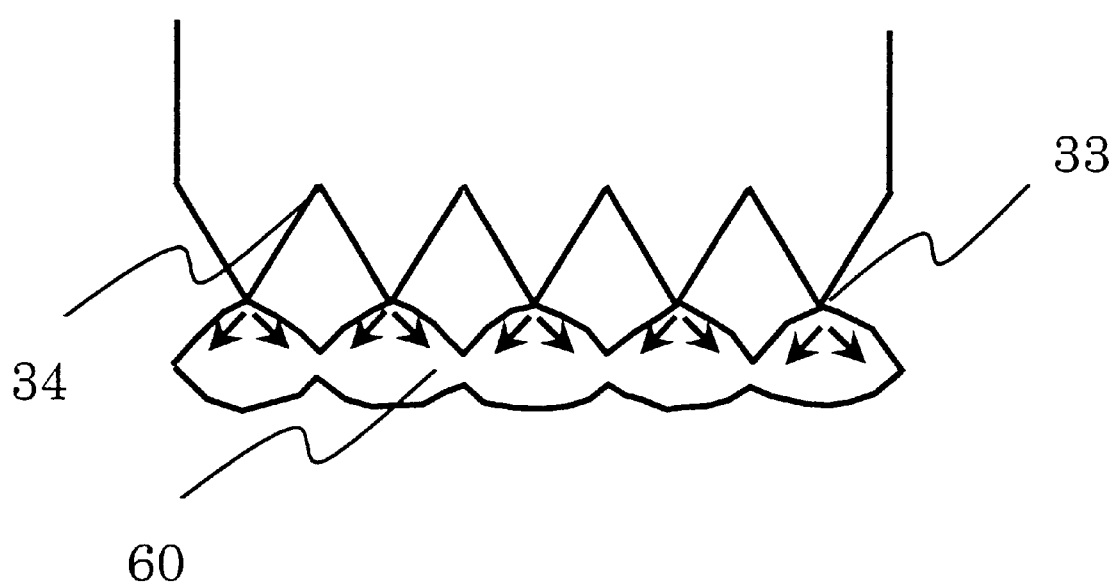
FIGS. 32 and 33 are cross sectional views each showing a completed silicon sheet and V grooves of the cooling roller of the present invention.

Cooling roller 32 is dipped into the silicon melt to form a silicon sheet on its surface. As shown in FIG. 32, cooled peaks 33 of V grooves are dipped into the silicon melt, so that the crystal nuclei of silicon are first produced at the peaks 33 of the V grooves. Crystal growth starts from based on the crystal nuclei. As crystal growth proceeds, the silicon crystals from adjacent peaks 33 of the V grooves combine to produce a silicon sheet 60.

The resultant silicon sheet has curved portions on the melt side. Namely, the portions where the crystal nuclei are first formed correspond to the peaks of the V or U grooves of cooling roller 32, and the silicon crystals which grow therefrom are sufficiently cooled in an initial stage of crystal growth. Thus, the shape of the sheet generally reflects the surface structure of the cooling roller. However, the sheet may not conform to the surface structure of the cooling roller completely, when removability is considered. If the silicon sheet conforms completely to the surface structure of the cooling roller 32, it means that the sheet tightly adheres to cooling roller 32. Thus, a silicon sheet with sufficient removability is not obtained.

On the melt side, the silicon melt is, partially, not completely cooled and still remains in the melt state. Such silicon provides curved portions with its force of gravity. Thus, a silicon sheet in a specific shape of the present invention is produced. In this method, an inexpensive silicon sheet can be provided because the slicing loss is saved and the curved portions provide corresponding reduction in the amount of silicon used.

Further, with use of the cooling roller 32 having V or U grooves, corrugated or wave-like silicon sheet can be directly formed on the cooling roller under manufacturing conditions of the silicon sheet. Namely, the silicon sheet has a feature on the side in contact with the cooling roller, in addition to the feature of the curved portions on the melt side.

If the coolant gas for cooling roller 32 is in sufficient or the rotating speed is sufficiently high, the crystal nuclei of silicon produced at the peaks of the V or U grooves of cooling roller 32 rapidly grow. Then, crystal growth of silicon starts, and the direction of crystal growth is determined by the cooling ability of the coolant gas or the rotating speed of cooling roller 32. If the cooling ability of the coolant gas is sufficient, the rotating speed of the roller 32 is high, and the melt temperature is low, silicon crystals grow after the crystal nuclei are produced along peaks 33 of the V or U grooves of cooling roller 32 in the direction toward the melt side, as shown in FIG. 32. Conversely, if the cooling ability of the coolant gas is insufficient, the rotating speed of cooling roller 32 is low, and the melt temperature is high, silicon crystals grow after the crystal nuclei are produced along peaks 33 of the V or U grooves of cooling roller 32 in the direction of the grooves of the cooling roller, as shown in FIG. 33.

Figure 33:
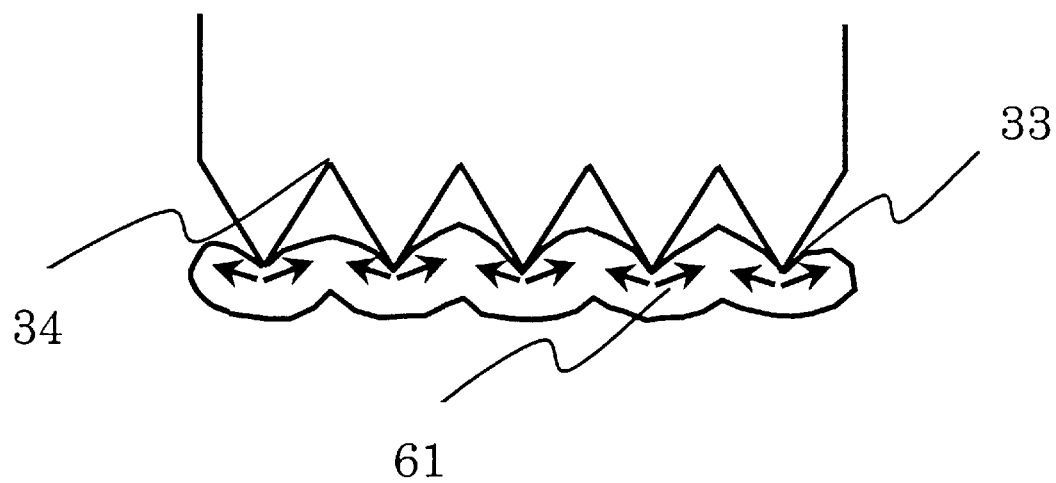

In any of the cases, the surface structure of the cooling roller and the silicon sheet would not completely conform to each other as shown in FIGS. 32 and 33. If the surface structure of the cooling roller completely conform to the silicon sheet, adhesion strength between the surface of the cooling roller and the silicon sheet is high, whereby removal becomes difficult. Thus, it is not desirable for serial production. As described above, by appropriately determining the conditions, a silicon sheet in a desired shape can be produced.

Although a silicon sheet in a corrugated or wave-like shape can be manufactured with use of a silicon wafer, such manufacture involves patterning by application of an oxide film or resist and subsequent etching. The resultant silicon sheet is polycrystalline, and therefore crystal grains of various plane directions exist. Thus, it is difficult to form the sheet in the corrugated or wave-like shape even by patterning since the etching speed varies according to the plane direction. Namely, a silicon sheet can be obtained inexpensively in this method of directing forming the silicon sheet in the corrugated or wave-like shape from the silicon melt.

As described above, by changing the cooling ability of the coolant gas, the rotating speed of the cooling roller, the melt temperature of the silicon melt and the like, a silicon sheet in a desired shape can readily be produced. In any case, the melt side has curved portions as in the present invention.

Preferably, only cooling roller 32 rotates with gas nozzle 35 shown in FIG. 31 fixed. If gas nozzle 35 rotates with cooling roller 32, the same portion is always cooled, whereby it becomes difficult to uniformly form the silicon sheet on the surface of cooling roller 32. Such a structure enables the internal portion of cooling roller 32 to be uniformly cooled, so that a uniform silicon sheet can be produced.

Although gas nozzles 35 are shown in FIG. 31 being above each other, the arrangement is not particularly limited to this. For the purpose of uniformly cooling, a plurality of gas nozzles 35 are arranged in radial directions rather than in one direction. Thus, the crystal nuclei can be produced more effectively on the surface of cooling roller 32, so that a uniform silicon sheet can be produced.

Preferably, an SiC film is formed on the surface of the V or U grooves in cooling roller 32. In the case where cooling roller 32 is formed of graphite, crystal nuclei of silicon are produced on a graphite surface, and therefore the silicon sheet would be produced on the graphite surface. In this case, when the silicon sheet is removed from the base, graphite may come off with the silicon sheet. The graphite adhering to the silicon sheet may be readily removed by etching with use of a mixture of nitric acid and hydrofluoric acid, but the number of processes cost increase. If a cooling roller of graphite is used, such roller is formed by cutting and shaping a graphite mold. It is almost impossible to completely remove the resulting cutting chips. The chips may fall into the silicon melt, thereby causing a problem associated with contamination of the silicon melt.

To solve the aforementioned problems, it is preferred that the surface of the cooling roller is coated with an SiC film or the like. Such a surface structure alleviates the problem of the graphite powder falling from cooling roller 32 and contamination of the silicon sheet. Particularly, the SiC film is preferably formed of a ceramic film, for which a technique for forming a high-purity film is available.

In addition, high adhesion strength of the graphite cooling roller and the SiC film prevents SiC from adhering to the produced silicon sheet when removing the sheet from the base.

Cooling roller 32 has in its surface V or U grooves, on which the SiC film is formed. As such, the SiC film at the peaks of the V or U grooves is dipped in the silicon melt. More specifically, the crystal nuclei of silicon are produced on the SiC film for production of the silicon sheet. Thus, the contact area of the cooling roller 32 and the silicon sheet becomes extremely small, whereby the adhesion strength of the silicon sheet and the cooling roller decreases. As a result, removability of the silicon sheet from cooling roller 32 improves.

A pitch of the V or U grooves in the surface of cooling roller 32 is at least 0.05 mm and at most 5 mm. If a pitch is smaller than 0.05 mm, silicon crystals begin to grow from peaks 33 of the V grooves to combine with those from adjacent peaks 33 at troughs 34 of the V grooves. As a result, the crystal grain size of the silicon sheet would be about half the pitch. Thus, the pitch smaller than 0.05 mm is not desirable when the sheet is to be used for a solar cell. A greater number of peaks of V or U grooves increases the adhesion area of the silicon to cooling roller 32. As a result, the adhesion strength of the silicon sheet and the cooling roller increases, whereby removal becomes difficult.

If a pitch of the grooves is greater than 5 mm, on the other hand, a longer time is required for the silicon crystals growing from peaks 33 to combine with one another to form a silicon sheet. In such a case, for example, the rotating speed of cooling roller 32 needs to be decreased. As a result, productivity decreases and inexpensive silicon sheet cannot be provided.

Preferably, the depth of the V or U grooves of cooling roller 32 is at least 0.05 and at most 5 mm. The height determines the dipping depth of cooling roller 32. More specifically, a greater depth allows the greater portion of the protrusions to be dipped into the melt, and vice versa. The silicon crystals grow in the silicon melt or near the surface of the silicon melt. Thus, the dipping depth needs to be appropriately determined as it determines the thickness of the sheet to be produced.

As described above, the V or U groove in the surface of the cooling roller allows the crystal grain size or silicon sheet thickness to be relatively readily controlled. The crystal grain size or silicon sheet thickness also depends on the temperature of a heater, the flow rate of coolant gas flowing through the cooling roller, the rotation speed of the cooling roller and the like, which can be appropriately determined to provide a silicon sheet with a desired thickness.

According to the present invention, a bar-like remover can be arranged in a mechanism for pulling out the produced silicon sheet. Since cooling roller 32 has V or U grooves, it is possible to arrange the leading end of the bar-like remover along trough 34. The shape of the remover may be for example in a comb, bar or polygon-like shape, while not limiting. It is preferred that its shape conforms to trough 34 and the height of the remover is smaller than the depth of the V or U grooves. Namely, any shape may be employed which conforms to trough 34 of cooling roller 32 and not is not dipped into the silicon melt. Such a structure enables the silicon sheet to be easily and continuously pulled out without complicating the apparatus. There is no need to stop the operation of the apparatus even if the silicon crystals break or fall during crystal growth, such silicon crystals simply fall down into the melt, whereby continuous operation is enabled.

Examples of the material for the remover may include a mold body of carbon, ceramics, tungsten, silicon nitride, boron nitride or the like, which are all materials stable in an inert ambient at high temperature, while not limiting. It is preferably the same material as the cooling roller because such material is maintained at the high temperature as being near the silicon melt and because such material does not cause damage to the surface of the cooling roller. Any shape conforming to the shape of the V or U groove may be employed, and the shape of the remover is limited to the bar-like shape. It may also be in a fork-like shape.

As described above, provision of the V or U groove in the surface of cooling roller 32 and a remover conforming thereto enables the produced silicon sheet to be readily removed from the cooling roller. The removed silicon sheet is transported by a guide roller to outside the chamber. Thus produced silicon sheet is cut by a microcutter, YAG laser or the like to have a desired size (length) and to provide silicon wafers.

Figure 34:
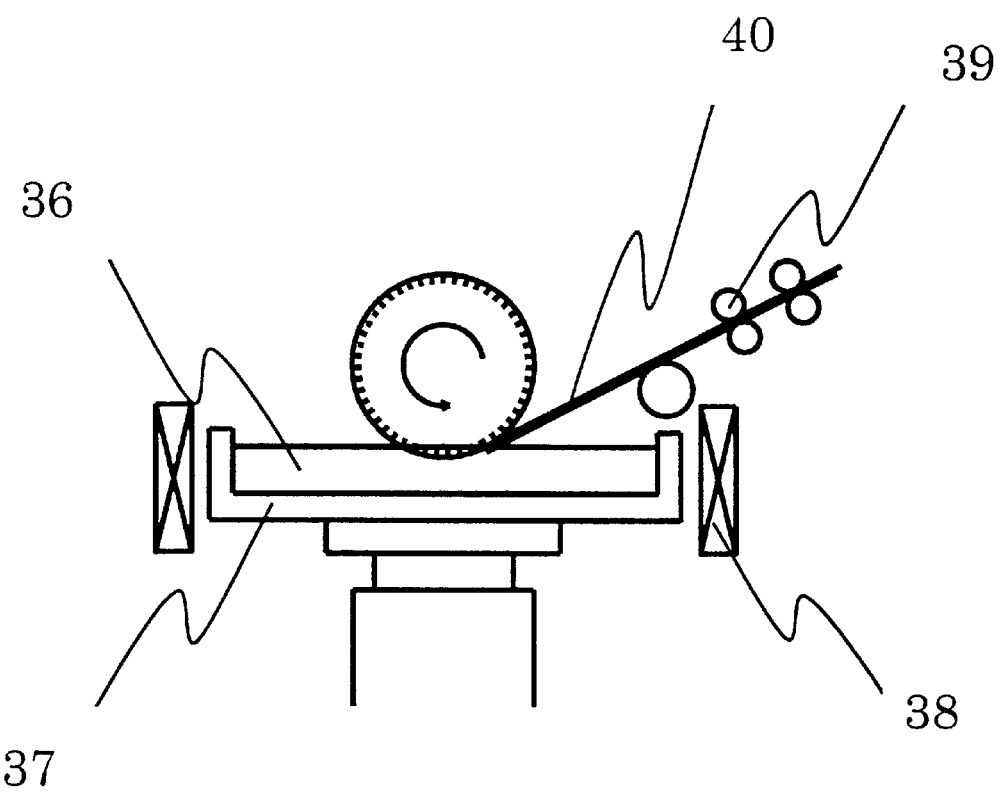
FIG. 34 is a schematic cross sectional view showing a silicon sheet manufacturing apparatus of the present invention.

FIG. 34 shows a general structure of a silicon sheet manufacturing apparatus. A silicon melt, crucible, heater for temperature control, guide roll for transportation, and silicon sheet are respectively denoted by reference numerals 36, 37, 38, 39, and 40. The silicon sheet manufacturing apparatus is arranged in a tightly sealed chamber, and gas exchange is performed by inert gas after evacuation. The gas may be for example Ar or He, but Ar is more preferable in terms of cost. Preferably, a plurality of heaters are arranged in the chamber for accurately controlling the temperature of the silicon melt. Accurate control of the temperature of the silicon melt enables the production of the silicon sheet with sufficient reproducibility. The temperature of the silicon melt is preferably at least the melting point of the silicon (about 1420° C.). Near the melting point, the dipping of the cooled roller into the melt may cause solidification at the surface of the melt, and therefore the melt temperature is preferably maintained at 1430° C. or higher.

Preferably, the crucible containing the melt silicon may be provided with an elevator. This is because the cooling roller must be dipped into the silicon melt always at the same depth to produce the silicon sheet on the cooling roller. The method of maintaining the position of the surface of the melt at the same level may include, for example, melting polycrystalline silicon ingot or introduction of silicon powders, while not limiting. However, it is preferable that fluctuation of the surface of the silicon melt is minimized.

The embodiments of the present invention will now be described.

First Embodiment

Although one embodiment of the method of manufacturing the sheet is disclosed herein, the scope of the present invention is not limited to this. In the present embodiment, a silicon sheet is manufactured.

A silicon material with boron concentration adjusted to have resistivity of 2Ω·cm was introduced into a crucible of quartz, which was protected by a crucible formed of high-purity carbon. The crucible was fixed in a chamber as shown in FIG. 30. The chamber was evacuated to have a pressure at or below $2 \times 10^{-5}$ torr. Thereafter, Ar gas was introduced to the chamber and the pressure was recovered to an atmospheric pressure. Subsequently, a flow of Ar gas was maintained from above the chamber, with a flow rate of 2 L/min.

Then, the temperature of the heater for melting silicon was set at 1500° C. and silicon was completely brought into a molten state. The melt surface was lowered as the silicon material melts. Thus, a silicon material was added by a pipe for introducing additional silicon material to maintain the position of the surface at a prescribed level. Then, the temperature of the silicon melt was set at 1430° C., which temperature was maintained for 30 minutes for stabilization. Then, without rotating the roller, nitrogen gas was sprayed to the internal portion of the roller with a flow rate of 700 L/min for cooling.

In this case, a base having linear and planar protrusions as shown in FIG. 3 was used. A pitch of linear protrusions was 1 mm and a width of planar protrusions was 1 mm. The depth of grooves was 1 mm and the outer dimension of the base was 50 mm×50 mm. In this case, a polygonal roller as shown in FIG. 27 was employed.

Thereafter, the quartz crucible was gradually elevated until it reaches the position allowing the base to be dipped into the melt by 3 mm. As such, the roller was rotated at 0.5 rpm for producing a silicon sheet. Immediately before the roller completes one rotation, the crucible table was lowered and dipping was stopped. The silicon sheet was pulled out when the chamber temperature was lowered to the room temperature. Then, the produced silicon sheet could be readily removed from the base. The silicon sheet had substantially the same size as the base, i.e., 50 mm×50 mm. The produced silicon sheet was substantially in the shape as shown in FIG. 11, where the maximum thickness was about 0.4 mm and the minimum thickness was about 0.25 mm.

Then, with use of the produced silicon sheet, a solar cell was manufactured. The silicon sheet was etched by a solution of nitric acid and hydrofluoric acid and cleaned. Then, alkali etching was performed by sodium hydroxide. Then, an n layer was formed on a p type substrate by diffusion of $POCl_3$. After removing the PSG film formed on the surface of the sheet by hydrofluoric acid, a silicon nitride film was formed on the n layer which was to be front side of the solar cell by plasma CVD. Then, the n layer formed on the back side of the solar cell was etched and removed by a solution of nitric acid and hydrofluoric acid to expose the p substrate. The back electrode and a p+ layer are formed thereon at the same time. Then, an electrode on the light receiving side was formed by screen printing. At the time, screen printing was performed such that the electrode was formed on the planar portion of the silicon sheet as shown in FIG. 14. Thereafter, solder dipping was performed to complete a solar cell. Thus manufactured solar cell was measured for its properties under irradiation condition of AM1.5, 100 mW/cm$^2$. The results were short-circuit current of 30.3 (mA/cm$^2$), open-circuit voltage of 590 (mV), fill factor of 0.69, and efficiency of 12.3 (%).

Second Embodiment

A silicon sheet and solar cell were manufactured in accordance with the same method as in the first embodiment except that the surface structure of the polygonal roller included only linear protrusions as shown in FIG. 1. A pitch of the linear protrusions of the base was 1 mm and the depth of the grooves was 1 mm. The surface of the sheet did not have any planar portion, so that a sub electrode was formed in parallel with the groove as shown in FIG. 13. The silicon sheet was in the same shape as in FIG. 5, where the thickness of the sheet was about 0.5 mm and the manufactured solar cell showed the following measurement results: short-circuit current of 28.3 (mA/cm$^2$), open-circuit voltage of 580 (mV), fill factor of 0.61, and efficiency of 10.0(%).

Third Embodiment

A silicon sheet and a solar cell were manufactured in the same method as in Embodiment 1 except that the surface structure of the polygonal roller included only dot-like protrusions as shown in FIG. 2. A pitch of the dot-like protrusions of the base was 0.1 mm and the depth of the grooves was 0.1 mm. The produced sheet did not have any planar portion, so that an electrode was formed in parallel with the sides of the base. The produced sheet was in the same shape as in FIG. 8, having a thickness of about 0.5 mm. The manufactured solar cell showed the following measurement results: short-circuit current of 29.8 (mA/cm$^2$), open-circuit voltage of 587 (mV), fill factor of 0.67, and efficiency of 11.7 (%).

Fourth Embodiment

A silicon sheet and solar cell were manufactured in the same method as in the first embodiment except that the surface structure of the polygonal roller had only dot-like protrusions and planar protrusions as shown in FIG. 4. A pitch of the dot-like protrusions of the base was 1.5 mm and the width of the planar protrusions was 1 mm. The depth of the grooves was 0.5 mm. The produced sheet was in the shape as shown in FIG. 12, having the thickness of about 0.3 mm. The manufactured solar cell showed the following measurement results: short-circuit current of 30.4 (mA/cm$^2$), open-circuit voltage of 588 (mV), fill factor of 0.69, and efficiency of 12.3 (%).

Fifth Embodiment

A silicon sheet and a solar cell were manufactured in the same method as in the first embodiment except that the flow rate of the coolant gas in the polygonal roller was 1200 L/min. The produced silicon sheet was in the shape shown in FIG. 11, having a thickness of about 0.5 mm. The manufactured solar cell showed the following measurement results: short-circuit current of 29.9 (mA/cm$^2$), open-circuit voltage of 588 (mV), fill factor of 0.68, and efficiency of 12.0 (%)

Sixth Embodiment

A silicon sheet and a solar cell were manufactured in the same method as in the first embodiment except that the flow rate of the coolant gas in the polygonal roller was 500 L/min. The produced silicon sheet was in the shape as shown in FIG. 11, having a thickness of about 0.7 mm. The manufactured solar cell showed the following measurement results: short-circuit current of 30.1 (mA/cm$^2$), open-circuit voltage of 590 (mV), fill factor of 0.68, and efficiency of 12.1 (%).

Comparison 1

A silicon sheet was manufactured in the same method as in the first embodiment except that the flow rate of the coolant gas in the polygonal roller was 50 L/min. The produced silicon sheet was in a shape similar to that shown in FIG. 11, but the silicon sheet could not be removed from the polygonal roller. Thus, a solar cell could not be manufactured.

Comparison 2

A silicon sheet was manufactured in the same method as in the first embodiment, and a solar cell was manufactured in the same method as in the first embodiment except that an electrode was formed in the portion other than the planar portion. The produced sheet has a thickness of about 0.5 mm, and the manufactured solar cell showed that following measurement results: short-circuit current of 29.1 (mA/cm$^2$), open-circuit voltage of 585 (mV), fill factor of 0.64, and efficiency of 10.9 (%).

Comparison 3

A silicon sheet was manufactured in the same method as in the first embodiment except that the surface structure of the polygonal roller had only a planar portion, free of protrusions, and a solar cell was also manufactured. The silicon sheet was mainly formed by dendritic growth and the surface structure of the produced silicon sheet was uneven. The manufactured solar cell showed the following measurement results: short-circuit current of 28.3 (mA/cm$^2$), open-circuit voltage of 580 (mV), fill factor of 0.65, and efficiency of 10.7 (%).

Seventh Embodiment

Although one embodiment of a method of manufacturing a sheet is described here, the scope of the present invention is not limited to this. In the present embodiment, a silicon sheet was manufactured. A silicon material of which boron concentration has been adjusted to have resistivity of 0.5 Ω·cm was introduced to a crucible of quartz protected by a high-purity carbon crucible. The crucible is then fixed in a chamber as shown in FIG. 30.

The chamber was evacuated to have a pressure at or below $2 \times 10^{-5}$ torr. Then, Ar gas was introduced into the chamber and the pressure was recovered to an atmospheric pressure. Subsequently, Ar gas was allowed to flow from above the chamber at 2 L/min. Then, the temperature of a heater for melting silicon was set at 1500° C. to completely bring the silicon into a molten state. At the time, the silicon material melts and hence decreases its surface level. Thus, the silicon material is further introduced by a pipe to adjust the surface level to a prescribed position. Then, the temperature of the silicon melt is set at 1450° C. and maintained thereat for 30 minutes for stabilization. Then, nitrogen gas is sprayed to the internal portion of the roller at 1000 L/min without rotating the roller for cooling.

In this case, a cylindrical roller having a surface structure including dot and planar protrusions as shown in FIG. 4 was used. A pitch of dot-like protrusions was 2 mm, a width of the planar protrusions was 1 mm, and the roller had a diameter of 800 mm.

Then, the quartz crucible was gradually elevated up to a level where the base was dipped into the melt by 4 mm, where the roller was rotated at 5 rpm for production of the silicon sheet. Immediately before the roller completes one rotation, the crucible table was lowered to stop heating. The silicon sheet was pulled out when the chamber attains to a room temperature. In this case, the silicon sheet could readily be removed from the base. The silicon sheet was cut to have a size of 50 mm×40 mm. The silicon sheet was in the shape as shown in FIG. 12, where the maximum thickness was about 0.3 mm and the minimum thickness was about 0.2 mm.

Then, a solar cell was manufactured using the produced silicon sheet. The produced silicon sheet was etched and cleaned using a solution of nitric acid and hydrofluoric acid and then subjected to alkali etching using sodium hydroxide. Thereafter, an n layer formed on a p type substrate by diffusion of POCl$_3$. A PSG film formed on the surface of the sheet was removed by hydrofluoric acid, and a silicon nitride film was formed on the n layer to be a light receiving side of the solar cell by plasma CVD. Then, the n layer formed on the back side of the solar cell was etched and removed by a solution of nitric acid and hydrofluoric acid, and the back electrode and p+ layer were formed at the same time. Then, an electrode on the light receiving side was formed by screen printing. Thereafter, solder dipping is performed to produce a solar cell. The manufactured solar cell was measured for its cell properties under radiation conditions of AM1.5, 100 mW/cm$^2$. The measurement results showed short-circuit current of 30.5 (mA/cm$^2$), open-circuit voltage of 589 (mV), fill factor of 0.70, and efficiency of 12.6 (%)

Comparison 4

A silicon sheet was manufactured by the same method as in the seventh embodiment except that the rotating speed of a cylindrical roller was 15 rpm. The produced silicon sheet had holes, because crystals were not formed at the grooves of the sheet.

Eighth Embodiment

A silicon sheet and a solar cell were manufactured in the same method as in the seventh embodiment except that the surface structure of the cylindrical roller had only linear and planar protrusions as shown in FIG. 18. A pitch of the linear protrusions of the base was 2 mm, a depth of the grooves was 0.1 mm, and width of the planar protrusion was 10 mm. The produced silicon sheet was in the shape as shown in FIG. 18, having a thickness of about 0.4 mm. The manufactured solar cell showed the following measurement results: short-circuit current of 29.8 (mA/cm$^2$), open-circuit voltage of 588 (mV), fill factor of 0.68, and efficiency of 11.9 (%).

Ninth Embodiment

A silicon sheet and a solar cell were manufactured in the same method as in the seventh embodiment except that the surface structure of the cylindrical roller had only dot-like protrusions and planar protrusions as shown in FIG. 19. A pitch of the linear protrusions of the base was 2 mm, a depth of the grooves was 1 mm, and a width of the planar protrusions was 10 mm. The produced silicon sheet was in the shape as shown in FIG. 19, having a thickness of about 0.4 mm, the manufactured solar cell showed the following measurement results: short-circuit current of 29.9 (mA/cm$^2$), open-circuit voltage of 589 (mV), fill factor of 0.67, and efficiency of 11.8 (%).

Tenth Embodiment

Although one embodiment of a method of manufacturing a sheet is described herein, the scope of the present invention is not limited to this. In the present embodiment, a silicon sheet was manufactured.

A silicon material of which boron concentration has been adjusted to have resistivity of 1 Ω·cm was introduced into a crucible of quartz protected by a high-impurity carbon crucible and brought into a molten state. Then, as shown in FIG. 24, a crucible having at its bottom an opening is placed on the base with protrusions. In this case, the base with linear and planar protrusions as shown in FIG. 3 was used. A pitch of the linear protrusions was 2 mm, a width of the planar protrusions was 2 mm, and a depth of the grooves was 0.1 mm. At the time, the base with protrusions was cooled down with a flow rate of coolant gas of 500 L/min. Thereafter, molten silicon is introduced into the crucible and, at the same time, the crucible is moved at a speed of 1m/min to produce a silicon sheet. The produced silicon sheet was substantially the same as the base in size, having 50 mm×50 mm. The produced silicon sheet had the maximum thickness of about 0.3 mm and the minimum thickness of about 0.15 mm.

Then, a solar cell was manufactured with use of the produced silicon sheet. The produced silicon sheet was subjected to alkali etching using sodium hydroxide. Then, an n layer was formed on a p type substrate by diffusion of POCl$_3$. The PSG film formed on the surface of the sheet was removed by hydrofluoric acid, and a TiO$_2$ film was formed on the n layer on the front side of the solar cell. Then, the n layer formed on the back side of the solar cell was etched and removed by a solution of nitric acid and hydrofluoric acid to expose the p substrate, on which the back electrode and p+ layer were simultaneously formed. Then, an electrode on the front side was formed by screen printing. The screen printing was performed to form an electrode at the planar portion of the silicon sheet. Then, solder dipping was performed to produce a solar cell. The produced solar cell was measured for its cell properties under irradiation conditions of AM1.5, 100 mW/cm². The measurement results showed short-circuit current of 25 (mA/cm²), open-circuit voltage of 571 (mV), fill factor of 0.65, and efficiency of 9.3 (%)

Eleventh Embodiment

A sheet was manufactured in the same method as in the tenth embodiment except for usage of nickel. The produced nickel sheet was in the shape as shown in FIG. 11, having a thickness of about 0.4 mm.

Twelfth Embodiment

A sheet was manufactured in the same method as in the tenth embodiment except for usage of aluminum and the base of FIG. 2. A pitch of dot-like protrusions was 1 mm, and a depth of the grooves was 0.6 mm. The produced aluminum sheet was in the shape as shown in FIG. 8, having a thickness of about 0.3 mm.

Thirteenth Embodiment

Although one embodiment of a method of manufacturing a silicon sheet and solar cell properties is described herein, the scope of the present invention is not limited to this. In the present embodiment, the base of the cooling roller had V grooves, for the purpose of observing variation in the shape of the silicon sheet according to the rotating speed.

High-purity silicon (purity of 99.999999999%) and, as a dopant thereof, a master alloy with boron, were prepared. A silicon material of which boron concentration had been adjusted to have resistivity of 2 Ω·cm was introduced into a quartz crucible protected by a high-purity carbon crucible. The crucible was fixed in a chamber (chamber wall is not shown) of the apparatus shown in FIG. 34. The chamber was evacuated to attain a pressure at or below $2\times10^{-5}$ torr. Then, Ar gas was introduced into the chamber so that the chamber attained an atmospheric pressure. Subsequently, a flow of Ar gas was maintained from above into the chamber at 2 L/min. Then, the temperature of a heater for melting silicon is set at 1500° C. to bring silicon completely in a molten state. At the time, as silicon material melted, its surface level significantly decreased. Thus, additional silicon material is introduced to adjust the surface of the melt at a prescribed level. Then, the silicon melt temperature is set at 1430° C., which temperature is maintained for 30 minutes for stabilization. Nitrogen gas is sprayed to the internal portion of the cooling roller at a flow rate of 700 L/min without rotating the cooling roller having a SiC film of 10 μm. A pitch of the V grooves of the cooling roller then used was 1 mm, and a depth of the grooves was 1 mm. Thereafter, the quartz crucible was gradually elevated to a level where the peaks of the V grooves of the roller were dipped into the melt by 3 mm. At this point, the roller was rotated at a rotating speed of 0.5 rpm, 5 rpm, and 10 rpm to produce a silicon sheet. The resultant silicon sheet had a thickness and average crystal grain size as shown in the following Table 1.

TABLE 1

| ROTATING SPEED (rpm) | THICKNESS (μm) | GRAIN SIZE (mm) |
| --- | --- | --- |
| 0.5 | 1000 | 0.8 |
| 5 | 600 | 0.7 |
| 10 | 300 | 0.5 |

As the rotating speed increases, the thickness of the silicon sheet as well as average crystal grain size decrease. Namely, by controlling rotation of the cooling roller, the thickness of the silicon sheet formed on the cooling roller can readily be controlled. In addition, the shape of the produced silicon sheet had a cross section as shown in FIG. 33 at 0.5 rpm, whereas the silicon sheet had a cross section as shown in FIG. 32 at 5 rpm, and 10 rpm.

Figure 35:
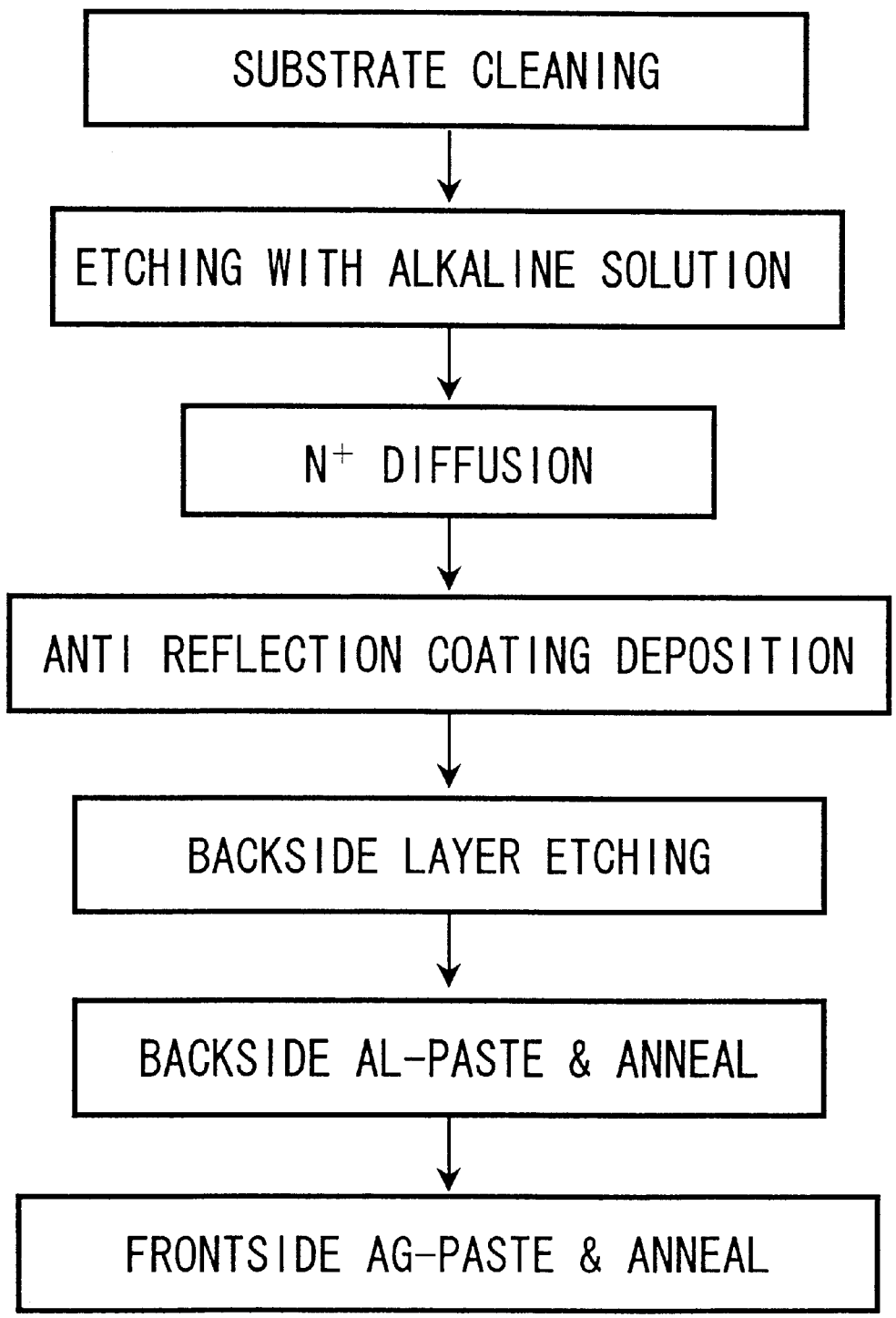
FIG. 35 is a chart showing a manufacturing process of a solar cell according to the present invention.

Then, a solar cell was manufactured in accordance with the procedure shown in conjunction with FIG. 35 with use of the produced silicon sheet. The silicon sheet was etched and cleaned by a solution of nitric acid and hydrofluoric acid and then subjected to alkali etching using sodium hydroxide. Then, an n layer was formed in a p type substrate by diffusion of $POCl_3$. After a PSG film formed on the surface of the base was removed by hydrofluoric acid, a titanium oxide film was formed on the n layer on the front side of the solar cell as a anti-reflection film. Then, the n layer formed on the back side of the solar cell was etched and removed by a solution of nitric acid and hydrofluoric acid to expose the p substrate, on which the back electrode and p+ layer were formed at the same time. Thereafter, the electrode on the front side was formed by screen printing and solder dipping is performed to produce a solar cell. The manufactured solar cell was measured for its cell properties under illumination conditions of AM1.5, 100 mW/cm². The cell properties of the prototype solar cell are as shown in the following Table 2.

TABLE 2

| ROTATING SPEED (rpm) | Jsc (mA/cm²) | Voc (mV) | FILL FACTOR | EFFICIENCY (%) |
| --- | --- | --- | --- | --- |
| 0.5 | 24.8 | 532 | 0.659 | 8.7 |
| 5 | 23.9 | 510 | 0.668 | 8.1 |
| 10 | 22.5 | 511 | 0.645 | 7.4 |

Although there is some difference in the properties of the solar cells according to the number of rotation, inexpensive solar cells can be provided because solar cell properties are given despite the simple cell process.

Fourteenth Embodiment

Although one embodiment of a method of manufacturing a silicon sheet and solar cell properties are described herein, the scope of the present invention is not limited to this. In the present embodiment, a cooling roller with U grooves is used, for the purpose of observing variation in the shape of the silicon sheet according to the flow rate of the coolant gas.

A master alloy with high-purity silicon (purity of 99.999999999%) and, as a dopant thereof, boron were prepared. A silicon material of which boron concentration had been adjusted to have resistivity of 3 Ω·cm was introduced into a quartz crucible protected by a high-purity carbon crucible. The crucible is fixed in a chamber (chamber wall is not shown) of an apparatus shown in FIG. 34. The chamber is evacuated to attain a pressure at or below $2\times10^{-5}$ torr. Then, Ar gas was introduced into the chamber to have the atmospheric pressure. Subsequently, a flow of Ar gas is maintained from above the chamber at 5 L/min. Then, the temperature of a heater for melting silicon is a set at 1500° C. to bring silicon completely into a molten state. Then, as the silicon material melted, its surface was significantly lowered. Thus, additional silicon material was introduced to adjust the melt surface to a prescribed level. Then, the silicon melt temperature was set at 1450° C., which temperature was maintained for 30 minutes for stabilization. Then, nitrogen gas was sprayed to the internal portion of the cooling roller having an SiC film of 100 μm with a flow rate of 1000 L/min without rotating the cooling roller. A pitch of U grooves of the cooling roller then employed was 5 mm, and a depth of the U grooves was 3 mm. Thereafter, the quartz crucible was gradually elevated to a level where the peaks of the U grooves of the roller were dipped by 3 mm. At that point, the roller is rotated at a rotating speed of 0.5 rpm for producing the silicon sheet. Further, by performing the similar operation, a silicon sheet was manufactured with the nitrogen gas flow rate of 800 L/min, and 500 L/min. The thickness and average crystal grain size of the produced silicon sheet are shown in the following Table 3.

TABLE 3

| FLOW RATE (L/min) | THICKNESS (μm) | GRAIN SIZE (mm) |
|---|---|---|
| 1000 | 900 | 2.5 |
| 800 | 800 | 2.7 |
| 500 | 750 | 2.8 |

From the above table, as the flow rate of the coolant gas decreases, the thickness of the silicon sheet also decreases. Namely, by controlling the flow rate of the coolant gas, the thickness of the silicon sheet formed on the cooling roller can readily be controlled. The silicon sheet had a cross section as shown in FIG. 32 with the flow rate of 1000 L/min and 800 L/min whereas the silicon sheet had a cross section as shown in FIG. 33 with the flow rate of 500 L/min.

Then, a solar cell was manufactured in accordance with the steps shown in conjunction with FIG. 35 with use of the produced silicon sheet. The produced silicon sheet was etched and cleaned by a solution of nitric acid and hydrofluoric acid and then subjected to alkali etching by sodium hydroxide. Then, an n layer was formed on a p type substrate by diffusion of PSG. The PSG film formed on the surface of the base was removed by hydrofluoric acid, and a silicon nitride film was formed on the n layer on the light receiving side of the solar cell as an anti-reflection film. Then, the n layer formed on the back side of the solar cell was etched and removed by a solution of nitric acid and hydrofluoric acid to expose a p substrate, and the back electrode and the p+ layer were formed thereon at the same time. Then, an electrode on the light receiving side was formed by screen printing. Thereafter, solder dipping was performed to produce a solar cell. The manufactured solar cell was measured for its cell properties under illumination conditions of AM1.5, 100 mW/cm². The cell properties of the prototype solar cell are shown in the following Table 4.

TABLE 4

| FLOW RATE (L/min) | Jsc (mA/cm²) | Voc (mV) | FILL FACTOR | EFFICIENCY (%) |
|---|---|---|---|---|
| 1000 | 23.3 | 550 | 0.71 | 9.1 |
| 800 | 23.3 | 545 | 0.70 | 8.9 |
| 500 | 23.3 | 553 | 0.69 | 8.9 |

Although there is some difference in properties of the solar cells according to the flow rate of the coolant gas, inexpensive solar cells can be provided because solar cell properties are provided despite the simple cell process.

Fifteenth Embodiment

Although one embodiment of a method of manufacturing a silicon sheet and solar cell properties are described herein, the scope of the present invention is not limited to this. In the present embodiment, a cooling roller with V grooves is used, for the purpose of observing variation in the shape of the silicon sheet according to a pitch of the V grooves.

A high purity silicon (purity of 99.999999999%) and master alloy included boron as a dopant were prepared. A silicon material of which boron concentration had been adjusted to have resistivity of 2 Ω·cm was introduced into a quartz crucible protected by a high-purity carbon crucible. The crucible was fixed in a chamber (chamber wall is not shown) in the apparatus shown in FIG. 34. The chamber was evacuated to attain a pressure at or below $2 \times 10^{-5}$ torr. Then, Ar gas was introduced into the chamber to attain a room pressure. Subsequently, a flow of Ar gas is maintained from above the chamber at 3 L/min. Then, the temperature of a heater for melting silicon was set at 1500° C. to completely bring silicon into a molten state. Then, as the silicon material melted, its surface level decreased. Thus, additional silicon material was introduced to adjust the surface to a prescribed level. Thereafter, the silicon melt temperature is set at 1435° C., which temperature was maintained for 30 minutes for stabilization. Then, nitrogen gas was sprayed to the internal portion of the cooling roller having an SiC film of 200 μm with a flow rate of 500 L/min for cooling without rotating the cooling roller. A pitch of the V grooves of the cooling roller then used was 0.05 mm and a depth of the grooves was 1 mm. Thereafter, the quartz crucible was gradually elevated to a level where peaks of the V grooves of the roller were dipped by 3 mm. At that point, the roller was rotated at the rotating speed of 10 rpm to produce a silicon sheet. By performing a similar operation, the silicon sheet was manufactured with a pitch of the cooling roller being 2 mm or 5 mm. The thickness and average grain size of the produced silicon sheet are shown in the following Table 5.

TABLE 5

| PITCH (mm) | THICKNESS (μm) | GRAIN SIZE (mm) |
|---|---|---|
| 0.05 | 300 | 0.03 |
| 2 | 400 | 0.95 |

As a pitch of the cooling roller increases, average grain size also increases. Namely, by controlling the pitch of the surface of the cooling roller, the crystal grain size of the silicon sheet formed on the cooling roller can readily be controlled.

Then, using the produced silicon sheet, a produced solar cell was manufactured in accordance with the steps shown in conjunction with FIG. 35. The produced silicon sheet was etched by acid and the base was cleaned. Then, an n layer was formed on a p type substrate by diffusion of $POCl_3$. A PSG film formed on the surface of the base was removed by flouric acid, and then a silicon nitride film was formed on an n layer on the light receiving side of the solar cell as an anti-reflection film. Then, the n layer formed on the back side of the solar cell was etched and removed by a solution of nitric acid and hydrofluoric acid to expose the p substrate, on which a back electrode and a p+ layer were formed at the same time. After an electrode on the light receiving side was formed by screen printing, solder dipping was performed to produce a solar cell. The manufactured solar cell was measured for its cell properties under illumination conditions of AM1.5, 100 $mW/cm^2$. The cell properties of the prototype solar cell were shown in the following Table 6.

TABLE 6

| PITCH (mm) | Jsc ($mA/cm^2$) | Voc (mV) | FILL FACTOR | EFFICIENCY (%) |
|---|---|---|---|---|
| 0.05 | 22.1 | 530 | 0.71 | 8.3 |
| 2 | 21.3 | 538 | 0.69 | 7.9 |
| 5 | 21.0 | 542 | 0.71 | 8.1 |

In particular, inexpensive silicon sheet can be provided because solar cell properties can still be given without performing alkali etching. Although there are some differences in property due to difference in pitch of the V grooves of the roller, inexpensive solar cells can be provided because solar cell properties can be still given despite the simple cell process.

Sixteenth Embodiment

A silicon sheet was manufactured in the same method as in the first embodiment except that the surfaces of the protrusions of a polygonal roller had two layers of BN and SiC films. The produced sheet exhibited good removability. The sheet was approximately in the shape as shown in FIG. 14.

Comparison 5

A silicon sheet was manufactured in the same method as in the first embodiment except that the polygonal roller was planar, free of protrusions, and having on its surface two layers of BN and SiC films. The produced sheet was partially removable.

As is apparent from the above, crystal nuclei can be first produced at the peaks of protrusions of the base, so that crystals from adjacent peaks combine together to form a sheet. Therefore, an inexpensive sheet with a desired thickness and shape can be rapidly produced with sufficient controllability. Further, as is also apparent from the above, silicon nuclei can be first produced at the peaks of the protrusions of the cooling roller, and crystals from the adjacent peaks combine above troughs of the protrusions to form a silicon sheet. Therefore, a silicon sheet with a desired thickness and crystal grain size can be inexpensively and rapidly formed with high controllability. If an SiC film is formed on the surface of the cooling roller, contamination of the silicon sheet by the material of the cooling roller can be prevented, whereby high quality silicon sheet can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A sheet produced by cooling a base having protrusions, dipping surfaces of said protrusions of the cooled base into a melt material containing at least one of a metal material and a semiconductor material, wherein said sheet has a curved portion obtained by forming crystals of said material in a curved shape on the surfaces of said protrusions.

2. A sheet produced by cooling a base having at least one of dot protrusions and linear protrusions in addition to planar protrusions and dipping surfaces of said protrusions of the cooled base into a material containing at least one of a metal material and a semiconductor material, wherein said sheet has curved portions and planar portions obtained respectively by forming crystals of said material in a curved shape on said dot protrusions or linear protrusions and by forming crystals of said material in a planar shape on said planar protrusions.

3. A solar cell produced by forming an electrode on a sheet formed by cooling a base with protrusions and dipping the surfaces of said protrusions of the cooled base into a melt material containing at least one of a metal material and a semiconductor material, wherein said sheet has curved portions obtained by forming crystals of said material in a curved shape on the surface of said protrusions.

4. A solar cell produced by forming an electrode on a sheet formed by cooling a base with at least one of dot protrusions and linear protrusions in addition to planar protrusions and dipping a surface of the cooled base into a melt material containing at least one of a metal material and a semiconductor material, wherein said sheet has curved portions and planar portions obtained respectively by forming crystals of said material in a curved shape on said dot protrusions or linear protrusions and by forming crystals of said material in a planar shape on said planar protrusions.

5. A solar cell produced by rotating a roller having on its peripheral surface protrusions having at least one of dot protrusions and linear protrusions and a cooling portion for cooling said protrusions, and dipping surfaces of the cooled protrusions into a silicon melt so that silicon crystals grow on the surfaces of said protrusions.

6. A sheet produced by cooling a base having protrusions, dipping surfaces of said protrusions of the cooled base into a melt material containing at least one of a metal material and a semiconductor material, wherein said sheet has a curved portion obtained by forming crystals of said material in a curved shape on the surfaces of said protrusions, and further wherein a pitch of the protrusions is at least 0.05 mm and at most 5 mm.

7. A sheet produced by cooling a base having protrusions, dipping surfaces of said protrusions of the cooled base into a melt material containing at least one of a metal material and a semiconductor material, wherein said sheet has a curved portion obtained by forming crystals of said material in a curved shape on the surfaces of said protrusions, and further wherein crystal growth of said material starts from said protrusions.

8. A solar cell produced by forming an electrode on a sheet formed by cooling a base with protrusions and dipping the surfaces of said protrusions of the cooled base into a melt material containing at least one of a metal material and a semiconductor material, wherein said sheet has curved portions obtained by forming crystals of said material in a curved shape on the surface of said protrusions, and further wherein a pitch of the protrusions is at least 0.05 mm and at most 5 mm.

9. A solar cell produced by forming an electrode on a sheet formed by cooling a base with protrusions and dipping the surfaces of said protrusions of the cooled base into a melt material containing at least one of a metal material and a semiconductor material, wherein said sheet has curved portions obtained by forming crystals of said material in a curved shape on the surface of said protrusions, and further wherein crystal growth of said material starts from said protrusions.

* * * * *